United States Patent [19]

Yamagata et al.

[11] Patent Number: 4,945,381
[45] Date of Patent: Jul. 31, 1990

[54] IMAGE FORMING APPARATUS

[75] Inventors: Kiyohiro Yamagata; Nobumasa Abe; Koichi Toba; Atsushi Kobayashi; Koji Watanabe, all of Nagano, Japan

[73] Assignee: Seiko Epson Corporation, Tokyo, Japan

[21] Appl. No.: 105,148

[22] Filed: Oct. 6, 1987

[30] Foreign Application Priority Data

| Oct. 7, 1986 | [JP] | Japan | 61-238273 |
| Oct. 17, 1986 | [JP] | Japan | 61-246691 |
| Dec. 2, 1986 | [JP] | Japan | 61-287466 |
| Apr. 24, 1987 | [JP] | Japan | 62-101194 |
| May 19, 1987 | [JP] | Japan | 62-121727 |
| May 27, 1987 | [JP] | Japan | 62-130424 |
| Jun. 16, 1987 | [JP] | Japan | 62-149681 |

[51] Int. Cl.$^5$ .................. G03B 27/32; G03B 27/52
[52] U.S. Cl. ........................... 355/27; 355/72; 430/138
[58] Field of Search ............... 355/27, 100, 72; 430/138

[56] References Cited

U.S. PATENT DOCUMENTS

| 2,466,524 | 4/1949 | Williams | 352/78 R |
| 3,248,029 | 4/1966 | Money | 352/166 |
| 3,278,252 | 10/1966 | Wagner et al. | 352/78 R |
| 3,905,698 | 9/1975 | Schroter et al. | 355/27 |
| 4,018,518 | 4/1977 | Wright | 352/78 R |
| 4,166,588 | 9/1979 | Krehbiel et al. | 355/72 |
| 4,365,018 | 12/1982 | Crutchfield et al. | 430/139 |
| 4,399,209 | 8/1983 | Sanders et al. | 430/138 |
| 4,440,846 | 4/1984 | Sanders et al. | 430/138 |
| 4,448,516 | 5/1984 | Arney et al. | 355/100 |
| 4,482,624 | 11/1984 | Arney et al. | 430/138 |
| 4,508,807 | 4/1985 | Adair | 430/138 |
| 4,554,235 | 11/1985 | Adair et al. | 430/138 |
| 4,576,891 | 3/1986 | Adair et al. | 430/138 |
| 4,578,339 | 3/1986 | Adkins | 430/138 |
| 4,587,194 | 5/1986 | Adair et al. | 430/138 |
| 4,600,678 | 7/1986 | Adair et al. | 430/138 |
| 4,624,560 | 11/1986 | Berry | 355/100 |
| 4,701,397 | 10/1987 | Rourke et al. | 430/138 |
| 4,714,943 | 12/1987 | Sakabara et al. | 355/27 |
| 4,727,392 | 2/1988 | Stone et al. | 430/138 |
| 4,742,374 | 5/1988 | Yamamoto et al. | 430/138 |
| 4,760,426 | 7/1988 | Taniguchi et al. | 355/27 |
| 4,768,050 | 8/1988 | Beery | 355/27 |

FOREIGN PATENT DOCUMENTS

| 52-34744 | 3/1977 | Japan | 355/27 |
| 54-644 | 1/1979 | Japan | 355/27 |
| 54-9941 | 1/1979 | Japan | 355/27 |

Primary Examiner—Monroe H. Hayes
Attorney, Agent, or Firm—Blum Kaplan

[57] ABSTRACT

An image forming apparatus include a photosensitive medium having light sensitive microcapsules thereon which are pressed against a receiving medium in order to transfer a latent image from the photosensitive medium to a developed image on the receiving image. A pressure developing device is employed which generates a load only during that period when the image is being developed on the receiving medium. A detachable container includes a cartridge for storing unexposed photosensitive medium and a cassette for storing the receiving medium includes detectors for determining the size of the receiving medium. A thermal treatment mechanism fixes the images formed on the receiving medium and imparts a glossy finish.

47 Claims, 31 Drawing Sheets

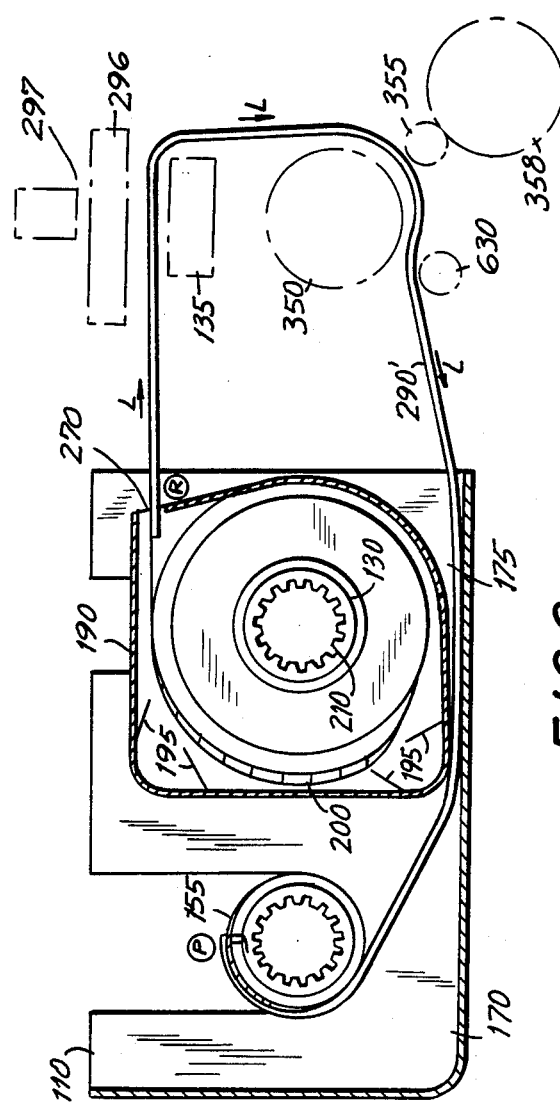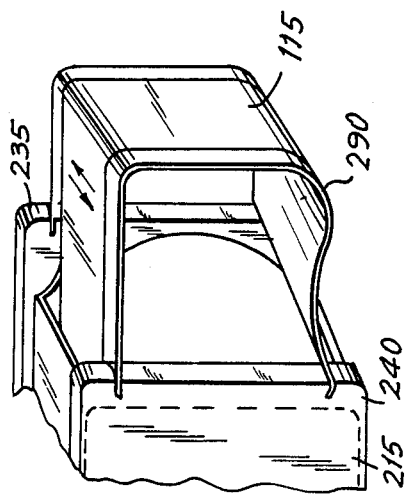

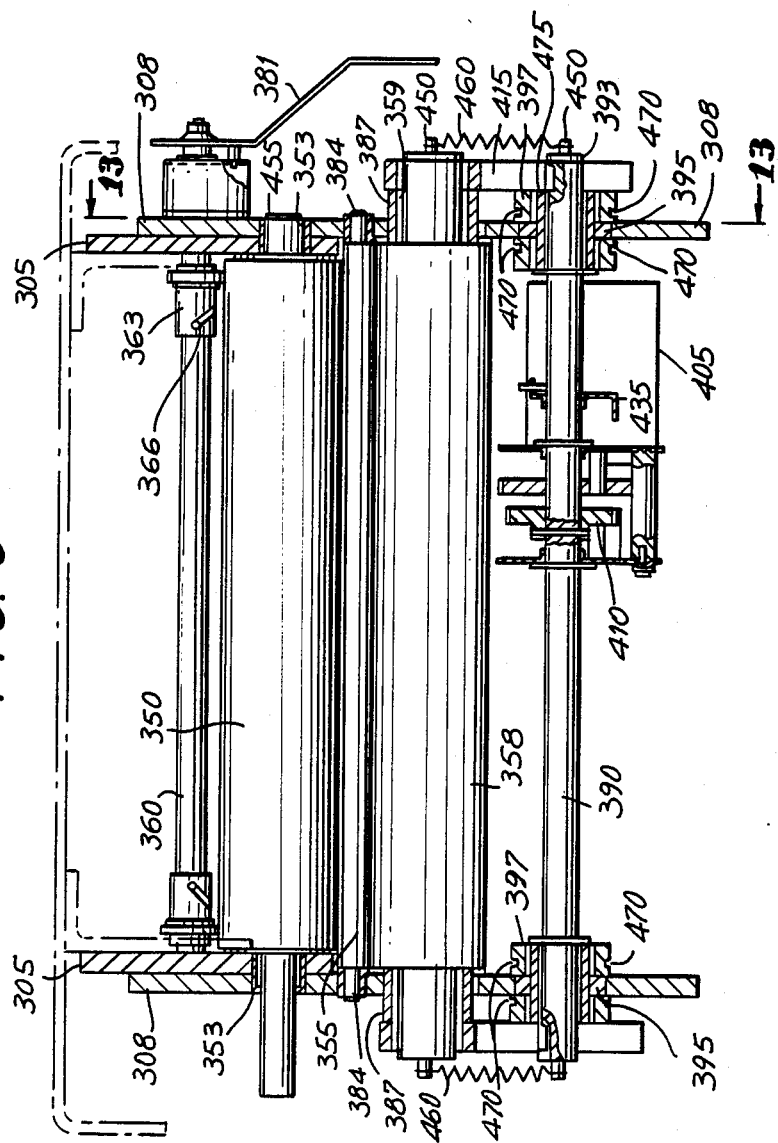

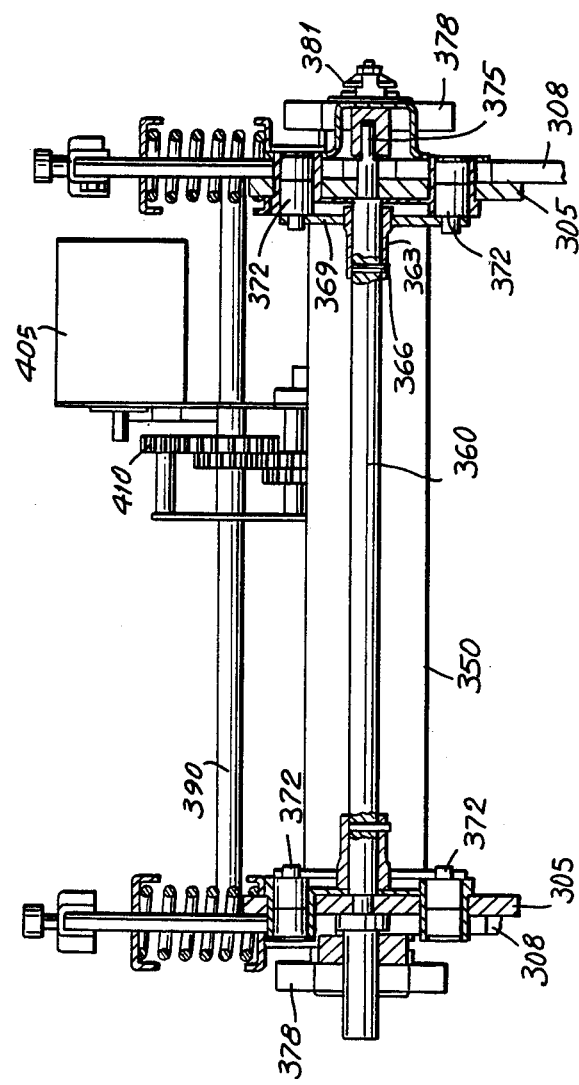

FIG. 13
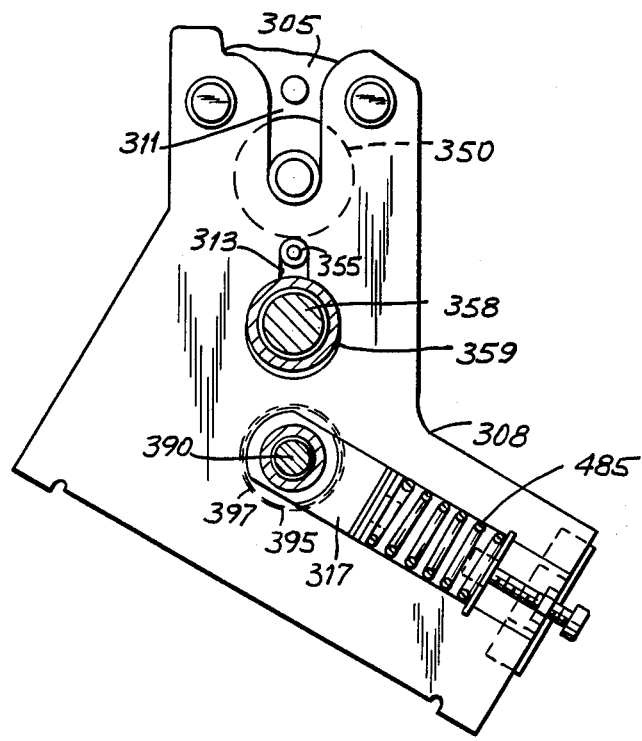
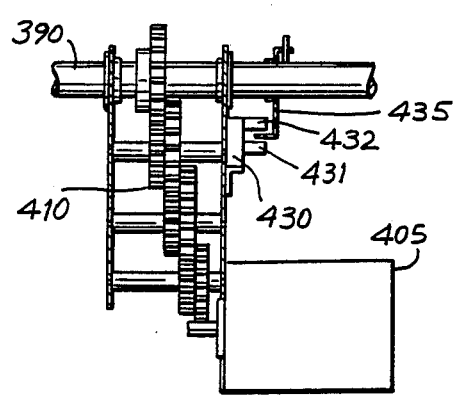
FIG. 14

FIG. 29
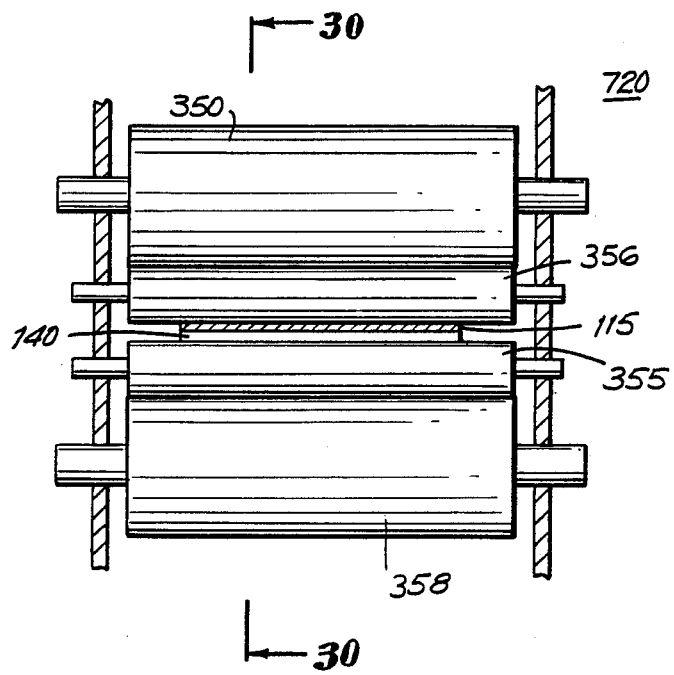
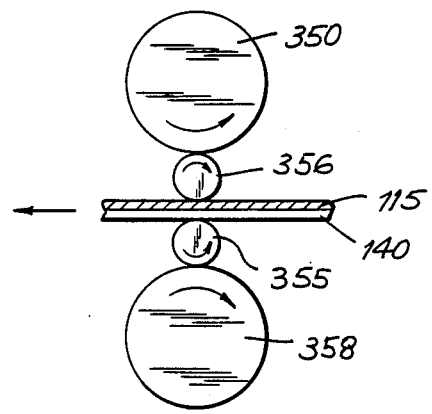
FIG. 30

FIG. 40
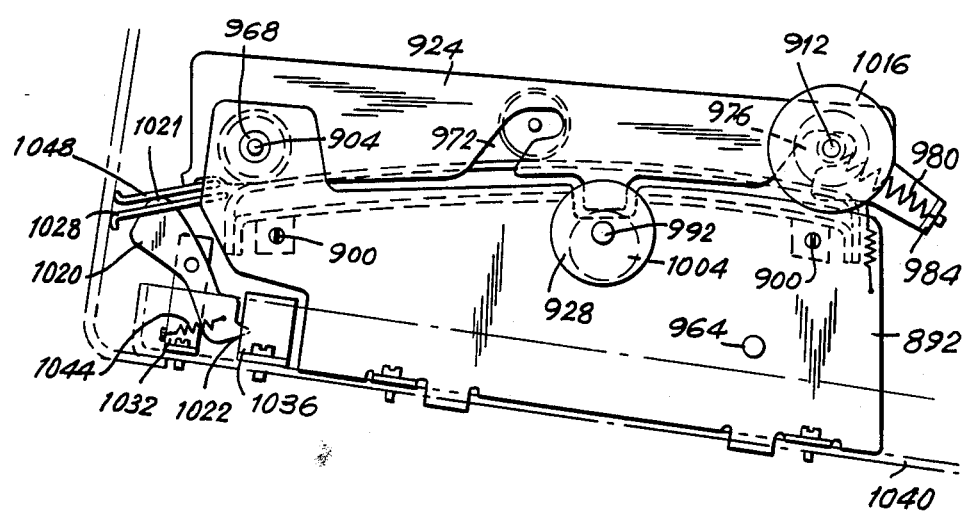
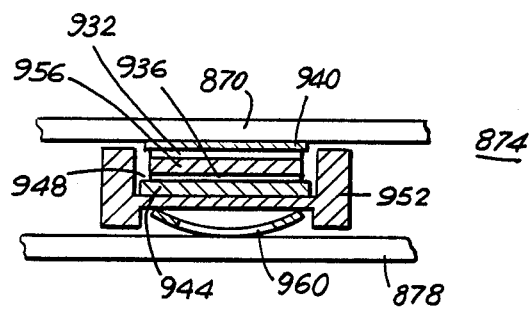
FIG. 41

IMAGE FORMING APPARATUS

BACKGROUND OF THE INVENTION

This invention relates generally to an image forming apparatus, and more particularly to an optical printer or copier in which a latent image formed on a photosensitive medium is pressed against a receiving sheet in order to form an image on the receiving sheet.

Generally, printers and copiers use an electrophotographic or silver halide photographic process to form an image on a photosensitive medium. For example, the electrophotographic process employed in a color copier includes the steps of applying toner powders representing the three primary colors of red, green and blue to a photosensitive drum and then selectively fixing the toner powders on a recording sheet to obtain the desired colored image. The silver halide photographic process includes the steps of forming a latent representation of the image on a photosensitive sheet followed by a visual reproduction of the image through a wet developing process using a liquid developer, a liquid stopper and a liquid fixer. Unfortunately, both the electrophotographic and silver halide photographic processes have several drawbacks.

The electrophotographic process used for copiers generally has poor tonal quality. Color copiers also require a feeding system for the receiving medium with a high degree of precision to prevent the receiving medium from being displaced during its path of travel within the copier. Displacement of the receiving medium, which can result in wrinkling of the receiving medium or jamming of the copier, is due partially to the difficulty in coordinating the timed path of travel of the receiving medium with the timed path of travel of the photosensitive medium. Coordination with the timed path of travel of the photosensitive medium is complicated by the photosensitive medium being repeatedly exposed to optical signals and toner transfer representative of the red, green and blue colored image. Displacement also can occur during the fixing (i.e. heating) of the image on the receiving medium to provide the red, green and blue coloring. Commercially available copiers providing such a high degree of precision in the feeding system for the receiving medium are large in size and costly to manufacture. The tendency of the receiving medium to become displaced during its path of travel within the copier also makes it more difficult to produce a clear, clean colored image on the receiving medium.

The materials used in silver halide photographic processing are not easy to handle due to the wet developing process employed. Silver halide photographic processing also generates an offensive odor and requires disposal of the waste solution and the use of expensive silver halide photographic paper. The silver halide photographic process is a complicated process which increases production costs and requires the use of equipment of large size and weight which is undesirable.

Accordingly, it is desirable to provide an image forming apparatus using a photographic process which produces an image of high tonal quality. The photographic process should also produce clean, clear colored images on the receiving medium, avoid the need to dispose of waste solution, eliminate the generation offensive odors, reduce operating costs and be housed within an apparatus which is smaller in size and weight than presently commercially available.

SUMMARY OF THE INVENTION

Generally speaking, in accordance with the invention, an image forming apparatus includes a photosensitive medium having light sensitive microcapsules thereon, each microcapsule including an optically hardening or softening agent and a color former which when pressurized against a receiving medium after exposure to light forms an image on the receiving medium. The apparatus includes exposing means for directing light representative of an image toward the photosensitive medium, a pressure developer for applying pressure to the photosensitive medium and receiving medium to form an image on the receiving medium and a thermal treatment mechanism for thermally treating the developed image to fix the image on the receiving medium. Other features of the invention include a detachable cassette for storing the exposed and unexposed portions of the photosensitive medium. The image forming apparatus can provide either a panchromatic or monochromatic image on the receiving medium.

In order to form a panchromatic image the microcapsules must be uniformly distributed on the substrate (i.e. front surface) with each microcapsule having a diameter of several micrometers. Each microcapsule contains a red, green or blue dye precursor and an optically hardening or softening matter. The optically hardening or softening matter reacts in response to the wavelength of light corresponding to the same color as its dye precursor. After exposure to the multicolored light of the image, the microcapsules may remain unaffected by the light or may harden or soften more or less in accordance with the wavelength and intensity of the light. The photosensitive medium is then superimposed and pressed against the receiving medium. The microcapsules not sufficiently hardened after exposure to the light are broken partially or completely. The dye precursor from each broken microcapsule escapes and reacts with a developer coated on the receiving medium to form a colored imaged on the receiving medium. The colored image produced on the receiving medium may have a high resolution as high as approximately 100 dots/millimeters. Individual sheets are used as the receiving medium for easy loading.

Accordingly, it is an object of this invention to provide an improved image forming apparatus which produces clear, clean and high resolution image having excellent color reproductivity and high tonal quality.

Another object of the invention to provide an image forming apparatus which is light in weight, small in size and relatively inexpensive to produce and operate.

A further object of the invention is to provide an image forming apparatus in which the photosensitive medium need be exposed only once to the light of a colored image in order to reproduce a colored copy.

Still another object of the invention is to provide an image forming apparatus which employs a dry developing process.

Still other objects and advantages of the invention will in part be obvious and will in part be apparent from the specification.

The invention accordingly comprises the several steps and the relation of one or more of such steps with respect to each of the others, and the apparatus embodying features of construction, combinations of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 5 is a cross-sectional perspective view of a portion of the cassette of FIG. 4;

FIG. 6 is front elevational view of a cassette for the photosensitive medium in accordance with another embodiment of the invention;

FIG. 9 is a side elevational view of a pressure developer in the apparatus of FIG. 1;

FIG. 10 is a top plan view of the pressure developer of FIG. 9;

FIG. 12 is a bottom plan view of the pressure developer of FIG. 11a;

FIG. 13 is a front elevational view of the pressure developer taken along line 13—13 of FIG. 9;

FIG. 14 is a bottom plan view of the pressure developer of FIG. 9;

FIG. 29 is a side elevational view of a pressure developer in accordancee with still another embodiment of the invention;

FIG. 30 is a cross-sectional view of the rollers taken along line 30—30 of FIG. 29;

FIG. 40 is a front elevation view of the thermal treatment mechanism of FIG. 38;

FIG. 41 is a cross-sectional view of a heater in the thermal treatment mechanism of FIG. 38;

FIG. 43b is side elevation view of the thermal treatment mechanism of FIG. 43a;

FIG. 44b is a side elevational view of the thermal treatment mechanism of FIG. 44a;

DESCRIPTION OF THE PREFERRED EMBODIMENTS

Figure 1:
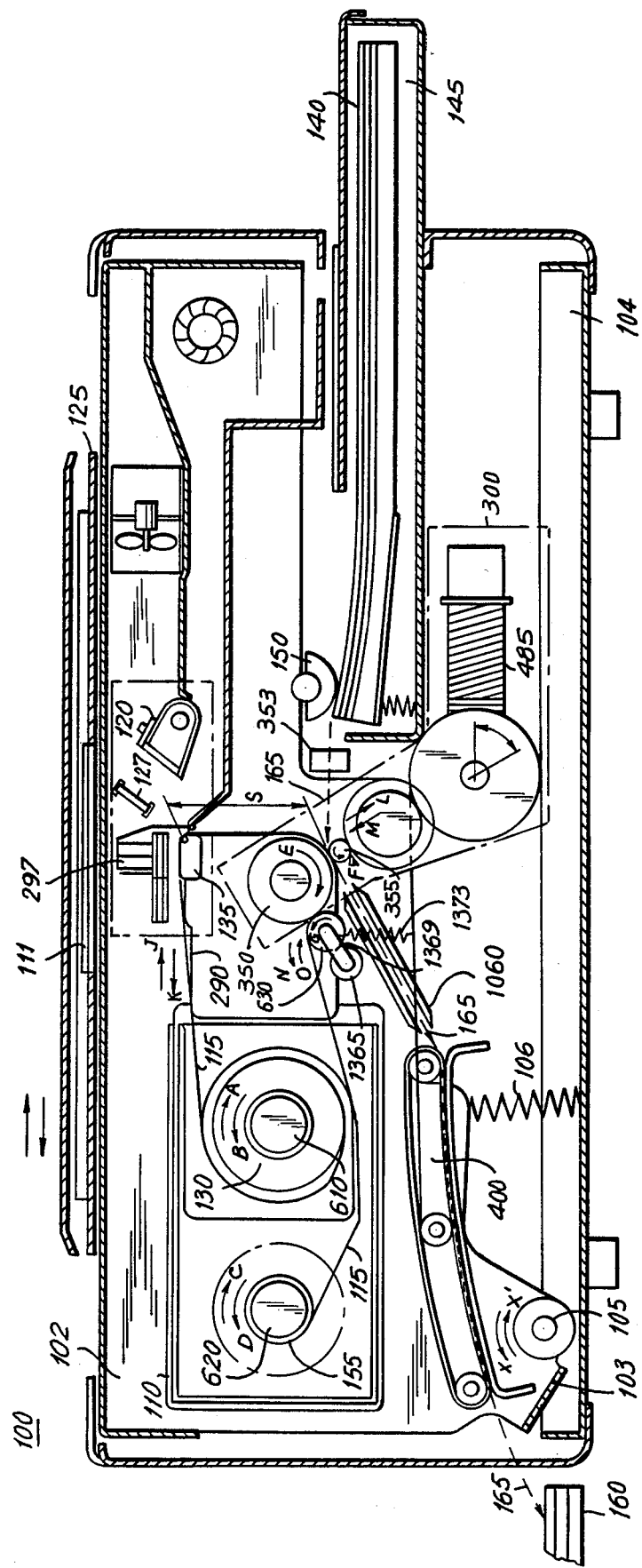
FIG. 1 is a front elevational view of an image forming apparatus constructed in accordance with one embodiment of the invention.
Figure 2:
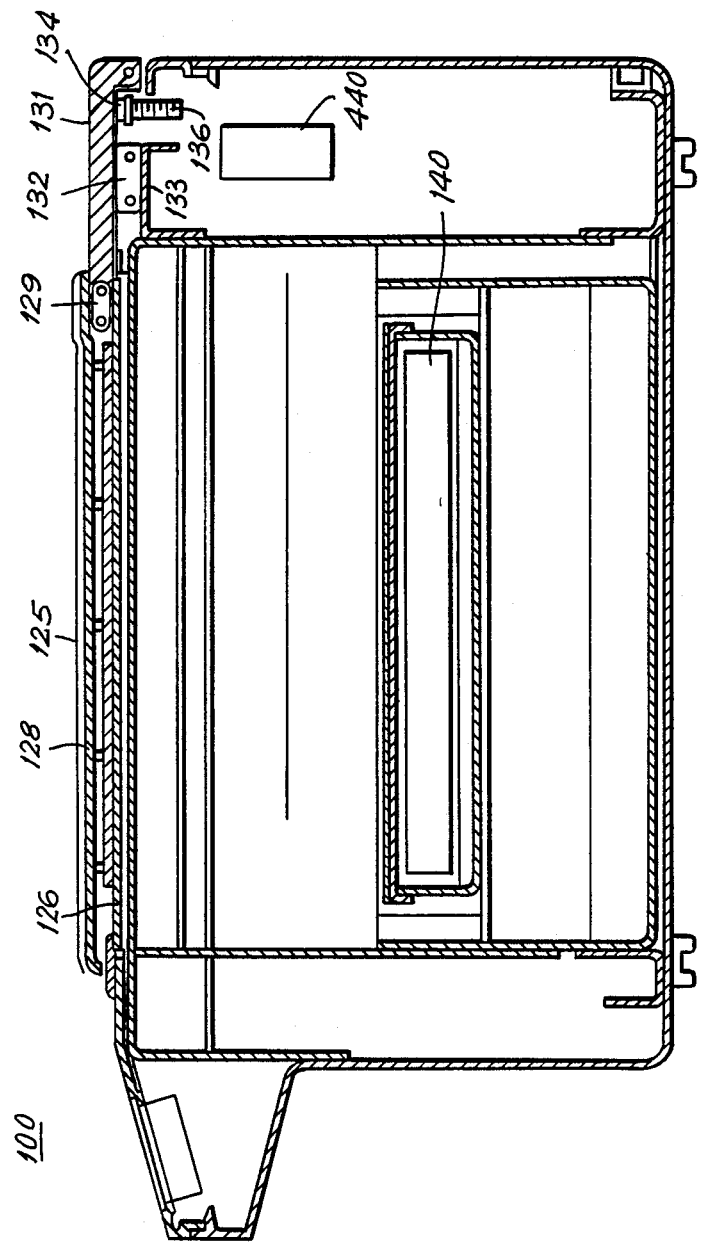
FIG. 2 is a side elevational view of the apparatus of FIG. 1.
Figure 3:
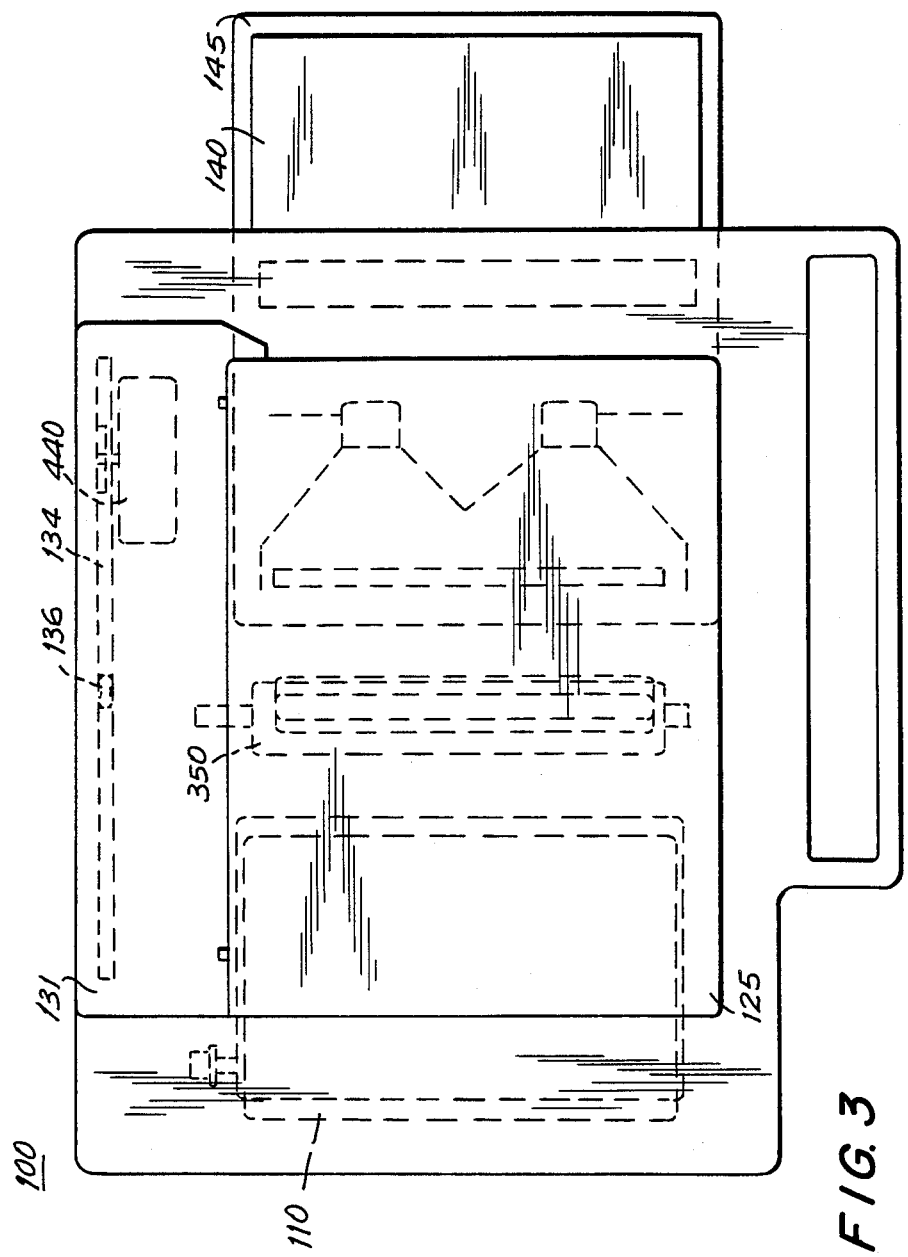
FIG. 3 is a top plan view of the apparatus of FIG. 1.

Referring to FIGS. 1-3, an image forming apparatus shown generally as 100 constructed and arranged in accordance with the invention includes a storage cassette 110, a light source 120 and a script table 125. Storage cassette 110 holds a photosensitive medium 115 and includes a supply shaft 130 and a storage shaft 155. Photosensitive medium 115 is wound about supply shaft 130 and a storage shaft 155 for storage prior to and after exposure from light representative of an image which is to be reproduced, respectively.

Script table 125 includes a glass plate 126 having a lid 128 mounted by a hinge 129. A movable table 131 moves on a side rail 132 mounted on a frame 133. Power is transmitted to moveable table 131 by a rack 134 secured to the lower surface of table 131 by a gear train or a belt 136. A document 111 is placed on glass plate 126 for reproduction. Lid 128 is then placed over and presses down on document 111.

Light produced by light source 120 is directed through a filter 127 onto document 111. Filter 127 absorbs or reflects heat rays transmitted by light source 120. The image of document 111 is formed on an exposure table 135 by an optical system 297 which includes a self focusing lens array sold by Nippon Sheet Glass Co., Ltd. under its trademark SELFOC LENS ARRAY. Unexposed photosensitive medium 115 is stored on a supply shaft 130 of cassette 110 and is dispensed in a direction from cassette 110 so as to pass directly beneath script table 125 and above exposure table 135. Script table 125 and photosensitive medium 115 travel in the same direction (denoted by arrow J) and at the same speed. A latent image of the document is stored by microcapsules which are uniformly distributed on the surface of photosensitive medium 115 as photosensitive medium 115 passes above exposure table 135.

As photosensitive medium 115 continues along its path of travel beyond exposure table 135 a receiving medium 140 is aligned against the exposed surface. The path of travel of receiving medium 140 through apparatus 100 is represented by dashed lines 165 of FIG. 1 and is stored in a cassette 145, such as a tray or other suitable holding device. Photosensitive 115 and receiving medium 140 come in contact with each other as they approach and then travel between a pair of pressure rollers 350 and 355 of a developing device 300. As pressure rollers 350 and 355 press photosensitive medium 115 and receiving medium 140 together, the microcapsules are broken in accordance with the latent image. The dye precursor within each microcapsule which is broken flows therefrom transferring the image onto receiving medium 140.

Thereafter, photosensitive medium 115 is separated from receiving medium 140 and is pressed against top pressure roller 350 by a pressing contact roller 630. A storage shaft 155 of cassette 110 takes up and stores the used/exposed portion of photosensitive medium 115 in a direction denoted by arrow C.

As receiving medium 140 is separated from photosensitive medium 115, receiving medium 140 is fed into a thermal treatment mechanism 400 wherein the image formed on receiving medium 140 is fixed and further developed so as to create a glossy, finished image thereon. Receiving medium 140 is then discharged from apparatus 100 and fed into a tray 160 or other suitable storage device.

Image forming apparatus 100 is lightweight, relatively small in size and easily handled by an operator. The image produced on receiving medium 140 has excellent tonal quality, resolution and overall appearance. The components of apparatus 100 will be discussed in greater detail below.

The photosensitive microcapsules which are suitable for use on photosensitive medium 115 may be of different compositions. Various photosensitive microcapsules and their compositions are disclosed in U.S. Pat. Nos. 4,365,018; 4,399,209; 4,440,846; 4,482,624; 4,508,807; 4,554,235; 4,576,891; 4,600,678; 4,578,339; and 4,587,194. These disclosures are incorporated herein by reference thereto.

The photosensitive imaging systems described in these United States Patents are commonly referred to as positive or negative imaging systems. In positive imaging systems the capsules exposed to light or radiation increase in viscosity so that there is no release of chromogenic material. In the negative imaging system, the chromogenic material is released from the microcapsules which have been exposed. In the preferred image forming apparatus described herein, the positive imaging systems are preferred. U.S. Pat. No. 4,576,891 describes photosensitive microcapsules which have sufficiently different sensitivities to be suitable for providing full color imaging. The colors are obtained by associating a radiation absorber with the microcapsules such that the sensitivity of the microcapsule is reduced over a portion of the spectral sensitivity range. Accordingly, the microcapsules provided on photosensitive medium 115 when exposed to light and upon contact with the developer on receiving medium 140 provide red, green and blue components of the original image.

Photosensitive Medium Cassette 110

Referring to FIGS. 1 and 4-6, cassette 110, which serves as a container for holding photosensitive medium 115 prior to and after exposure to light generated by light source 120, includes a housing 170 and a cartridge 175 for storing the unexposed portion of photosensitive medium 115.

Cartridge 175 includes guides 180 which are located near the ends of cartridge 175 for controlling and inhibiting lateral movement of the unexposed portion of photosensitive medium 115 as it is dispensed from cartridge 175. Each guide 180 has a cylindrical portion 185 protruding from the interior surface of guide 180 and an armor portion 190 which serves as side walls for cartridge 175. Armor portion 190 circumscribes and closely follows the contour of cylindrical portion 185. On the interior surface of armor portion 190 are dousers 195 which are flocked or coated black to absorb light. Dousers 195 extend from the interior surface of armor portion 190 and are dimensioned so as not to contact the unexposed portion of photosensitive medium 115 which is stored about supply shaft 130. Guides 180 are molded from materials having opaque qualities, that is, which absorb or otherwise prevent light from entering cartridge 175. Suitable materials exhibiting such opaque qualities include, but are not limited to, black series synthetic resin plate, black painted metal plate, and black hard paper.

On the exterior surface of cylindrical portion 185 is a plurality of convex threads 200 which are in direct contact with the rear surface of photosensitive medium 115 to prevent adhesion between photosensitive medium 115 and cylindrical portion 185.

Guide 185 includes a hollow cylindrical interior through which supply shaft 130 extends. Supply shaft 130 around which photosensitive medium 115 is wound has bearing portions 205 at both ends thereof. Each bearing portion 205 includes internal teeth 210 extending around its inner circumference. Internal teeth 210 mesh with external teeth from a rewinding shaft 610 (shown in FIGS. 1 and 46). Rewinding shaft 610 is operable for applying tension to photosensitive medium 115 when the latter is dispensed in a forward direction as denoted by an arrow A in FIG. 1 and for rewinding photosensitive medium 115 in a reverse direction as denoted by an arrow B also shown in FIG. 1.

Cartridge 175 also includes side plates 215 having centrally positioned substantially circular openings through which supply shaft 130 extends. Plates 215 serve as the end walls for cartridge 175 and as supports for supply shaft 130. Guides 180 are connected to the interior surfaces of plates 215 without any gaps therebetween.

Figure 4:
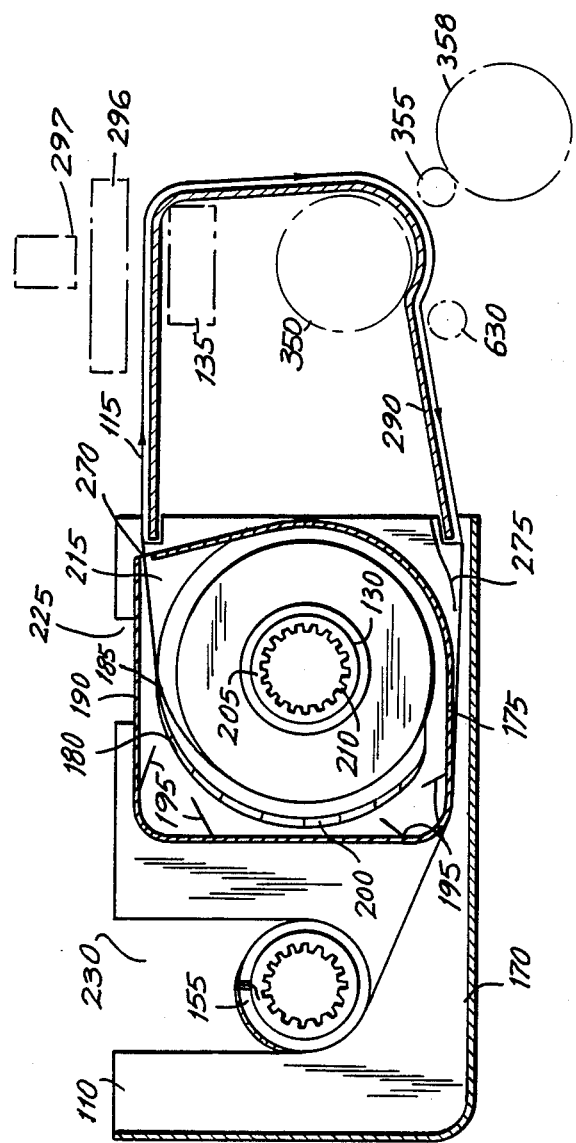
FIG. 4 is a front elevational view of a cassette for holding photosensitive medium for the apparatus of FIG. 1.
Figure 7:
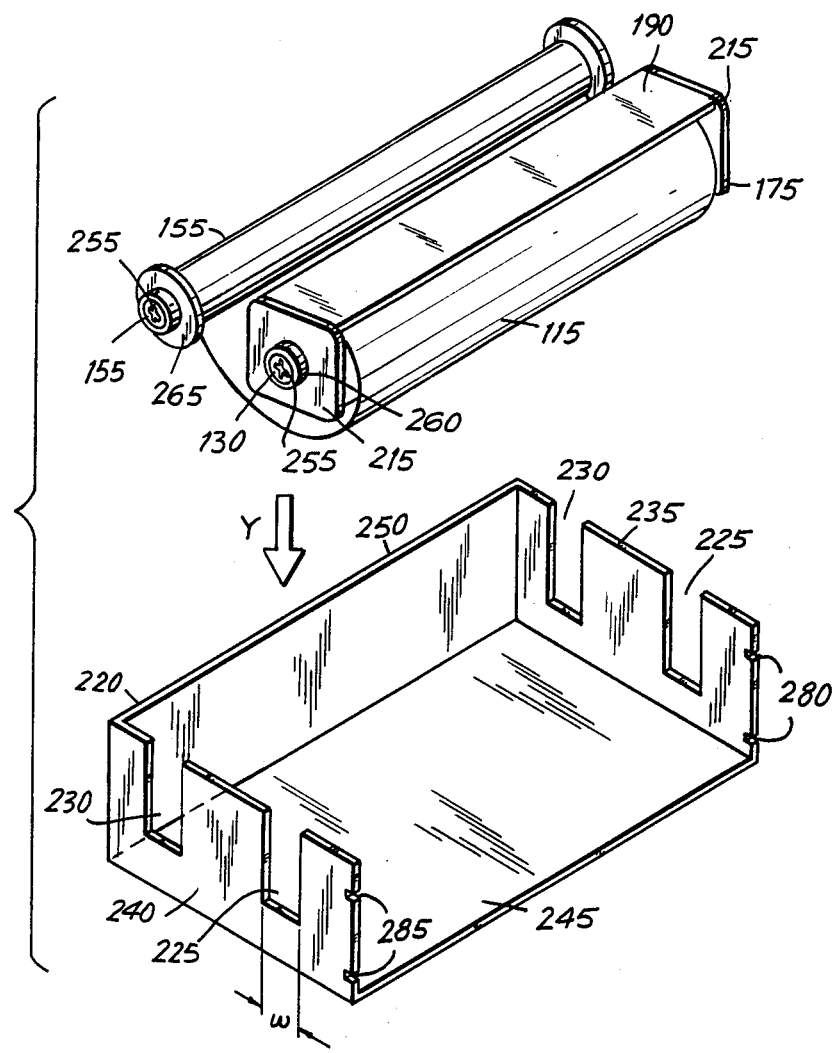
FIG. 7 is an exploded perspective view of the photosensitive medium in FIG. 4.

As shown in FIG. 7, cassette 110 also includes an open ended box 220. Cartridge 175 and storage shaft 155 can be inserted into and removed from box 220. Box 220 is formed from a thin plate of metal or synthetic resin having pairs of cutouts 225 and 230. Cutouts 225 and 230 are each on opposing sidewalls 235 and 240. Box 220 is also formed from an opaque material such as, but not limited to, black series sythetic resin plate, black painted metal plate and black hard paper. Box 220 includes a floor 245, a rear wall 250 but has no top or front walls. Cutouts 225 and 230 have substantially rectangular perimeters for receiving the ends of supply shaft 130 and storage shaft 155, respectively. As shown in FIG. 7, one end face of supply shaft 130 and storage shaft 155 can be formed with slits 255 rather than internal teeth 210 as shown in FIG. 4. Internal teeth 210 or internal cross slits 255 are operable for mating with external teeth or external cross shaped members protruding from the end faces of rewinding shaft 610 and takeup shaft 620, respectively. Consequently, torques applied to rewinding shaft 610 and takeup shaft 620 are transmitted to supply shaft 130 and storage shaft 155, respectively.

Mounted on each end of supply shaft 130 and storage shaft 155 are bearing rings 260 and 265 having outer peripheries which resiliently engage and tighten within the widths of cutouts 225 and 230, respectively. Additionally, rings 260 and 265 have inner walls for rotatably supporting supply shaft 130 and storage shaft 155, respectively.

In assemblying cartridge 175 and storage shaft 155 within box 220, photosensitive medium 115 is slightly drawn from cartridge 175 and is wound around storage shaft 155. Cartridge 175 and storage shaft 155 are then inserted into box 220 in the direction shown by an arrow Y with bearing rings 260 and 265 being pressingly mounted into cutouts 225 and 230 of box 220, respectively. As shown in FIG. 4, the unexposed portion of photosensitive medium 115 which is within cartridge 175 is dispensed through a discharge port 270 and after exposure is stored within cassette 110 through a storage port 275.

Side walls 235 and 240 have pairs of slots 280 and 285 into which a member 290 is detachably secured, respectively. Member 290 closely resembles the path travelled by photosensitive medium 115 within apparatus 100 from the time it is dispensed through discharge port 270 until it returns through storage port 275. Member 290 is preferably shaped so that it can be removably inserted within the gaps existing between exposure table 130 and optical system 297, between top pressure roller 350 and intermediate pressure roller 355, and between top pressure roller 350 and pressing contact roller 630.

Once cartridge 175 and storage shaft 155 have been assembled within box 220 of cassette 110, photosensitive medium 115 is further unwound from supply shaft 130 so as to enable photosensitive medium 115 to fit along the outside surface of member 290. Member 290 is then slipped under photosensitive medium 115 and attached to walls 235 and 240 within notches 280 and 285 of box 320, respectively.

Member 290 is made from material which will not damage photosensitive medium 115 when the former is in contact with the latter. Suitable materials for member 290 include, but are not limited to, thick paper and synthetic resin. Preferably, member 290 should be approximately 0.1 to 0.2 millimeters in thickness. When the thickness is less than 0.1 millimeters, member 290 can be easily bent out of shape due to its low rigidity. For thicknesses of greater than 0.2 micrometers the gaps between top pressure roller 350 and intermediate pressure roller 355, between exposure table 135 and a filter 296 of optical 297, and between top pressure roller 350 and pressing contact roller 630 undesirably need to be greater to accommodate the extra thickness.

Cassette 110 with member 290 attached thereto is inserted within apparatus 100, with the interior perimeter of member 290 mounted on the outer peripheries of exposure table 135 and top pressure roller 350. At the same time, cassette 110 is pressingly inserted within apparatus 100 in the same direction as member 290 is held in place within the interior body of apparatus 100 by any suitable engagement means. Thereafter, with cassette 110 secured within apparatus 100, member 290 is disconnected from cassette 110 leaving photosensitive medium 115 properly positioned within the gaps between exposure table 135 and filter 296, between top pressure roller 350 and intermediate pressure roller 355, and between top pressure roller 350 and pressing contact rollers 630. Any slack which may exist within photosensitive medium 115 is removed. Upon exhausting the supply of unused/unexposed photosensitive medium 115, no portion of photosensitive medium 115 remains on supply shaft 130 and instead is now stored on storage shaft 155.

As shown in FIG. 6, a member 290' rather than member 290 may be used in conjunction with cassettte 110 for properly positioning photosensitive medium 115 within apparatus 100. More particularly, member 290' is connected to the beginning of photosensitive medium 115 at point R (i.e. discharge port 270) and to storage shaft 155 at point P. Member 290' is made from a wood free paper having a relatively high rigidity and a thickness of approximately 0.1 micrometers. Member 290' is nevertheless sufficiently flexible to allow it to travel along the path denoted by an arrow L and to be wound around shaft 155. Accordingly, member 290 serves as a complete guide for photosensitive medium 115 as it travels between supply shaft 130 and storage shaft 155.

Due to photosensitive medium 115 being uniformly coated with microcapsules, each of which contains dye precursors, it is essential that each of the microcapsules not be broken until recording medium 140 is properly positioned next to photosensitive medium 115. Otherwise, microcapsules broken before the end of the pressure developing process, as described below, can significantly deteriorate the image to be formed on recordng medium 140 due to the flow of dye precursor from the broken microcapsules.

Members 290 and 290' significantly aid in the prevention of microcapsules being broken during insertion of cassette 110 and positioning of photosensitive medium 115 within apparatus 100. Furthermore, by providing support to photosensitive medium 115 during its insertion within apparatus 100 and through contact with only its rear surface, the opportunity for the microcapsules on photosensitive medium 115 to be inadvertently broken is significantly lessened resulting in a uniformly high quality image being reproduced. Furthermore, by providing the unexposed portion of photosensitive medium 115 within an opaque cartridge 175, exposure of the former to light during insertion within apparatus 100 is eliminated. Cassette 110 also facilitates wrapping photosensitive medium 115 around supply shaft 155. The modular type elements provided within cassette 110 and cassette 110 itself also aid in the ease of properly positioning photosensitive medium 110 within apparatus 100 and in providing maintenance thereto. Disposal of photosensitive medium 115 is accomplished simply and quickly by merely replacing cassette 110. Disposal, however, need not be attended to until photosensitive medium 115 has been used (i.e., no unexposed portion remains).

Moreover, photosensitive medium 115 is extremely thin (approximately 25 micrometers in thickness) and thus is relatively weak as well as being relatively wide and can present significant problems in handling during insertion into apparatus 100. Members 290 and 290', however, provide the rigid guide necessary for photosensitive member 115 to rest upon during insertion of cassette 110 into apparatus 100. Accordingly, members 290 and 290' ensure that no wrinkling or jamming of photosensitive medium 115 within apparatus 100 occurs due to improperly loading photosensitive medium 115 within apparatus 100. Still further, by providing storage shaft 155 within cassette 110, the need for a separate storage shaft elsewhere within apparatus 100 is eliminated. Cassette 110 thus provides an effective simplified transport system for photosensitive medium 115.

Pressure Developing Device 300

Pressure developing device 300 is relatively small in size and weight relative to comparable pressure developing devices commercially available. Pressure device 300 is also capable of applying uniform pressure across the entire width of photosensitive medium 115 as the latter travels between top pressure roller 350 and intermediate pressure roller 355.

Figure 8:
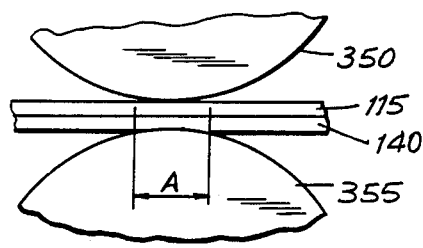
FIG. 8 is a front elevational view of the nip portion of a pair of pressure rollers in the apparatus of FIG. 1.

Typical pressures developed by pressure developing device 300, which are required for properly breaking the microcapsules on photosensitive medium 115, are approximately 1000 kg/cm$^2$. In generating such pressures, intermediate pressure roller 355 has a smaller diameter than top pressure roller 350. Preferably, intermediate pressure roller 355 has a diameter of 4 to 10 mm. Consequently, the contact width A (nip width) shown in FIG. 8 is decreased so that a sufficiently high pressure can be generated between top pressure roller 350 and intermediate pressure roller 355 with a relatively low input load. A roller of larger diameter is preferably disposed next adjacent to intermediate roller 355 to prevent deflection of the latter and to ensure that intermediate roller 355 uniformly presses against receiving medium 140.

Pressure developing device 300 is designed for intermediate pressure roller 355 to move into or out of contact with top pressure roller 350 based on a cam mechanism. Pressure generated by pressure developing device 300 is thus selectively applied against photosensitive medium 115 and receiving medium 140 only during those times when photosensitive medium 115 and receiving medium 140 are in contact with each other and are positioned between top pressure roller 350 and intermediate pressure roller 355. Developing device 300 also is designed to facilitate maintenance or replacement of photosensitive medium 115.

Pressure device 300 is constructed such that it is operable for separating into two sections. Apparatus 100 is therefore operable for opening and vertically dividing with path 165 of receiving medium 140 serving as a boundary along which apparatus 100 opens.

Referring now to FIGS. 9-14, device 300 includes two inner coupling support plates 305 which are secured to the body of apparatus 100. Top pressure roller 350 is rotatably engaged within inner coupling support plates 305 through bearings 353. A shaft 360 is also rotatably engaged with coupling support plates 305. A collar 363 formed with a spiral groove through 180° is slidably mounted onto shaft 360. The spiral groove is engaged with a pin 366 mounted on shaft 360. A plate 369 is attached to collar 363. On both ends of plate 369 are openings through which a pair of stationary slide pins 372 extend engaging coupling support plate 305 and a pair of outer coupling support plates 308. Support plates 308 are secured to the interior surfaces of a bottom frame 104 shown in FIG. 1.

As viewed in FIG. 10, a meshing pin 375 is attached to the right end of shaft 360 and locked thereto by a fixing ring 378. A lever 381 is mounted on and to the end of meshing pin 378.

Referring once again to FIG. 9, intermediate pressure roller 355 and a bottom pressure roller 358 are rotatably engaged to outer coupling support plate 308 through a pair of shafts 384 and 387, respectively. Shaft 387 extends through and its movement is regulated by the perimeter of an opening 359 of outer coupling support plate 308. An application shaft 390 is also rotatably engaged by outer support plate 308 through a shaft receiver 393 and a pair of sleeves 395. Top pressure roller 350 is in contact with outer support plate 308 except when top frame 15 has been opened. Slide pins 372 couple each outer coupling support plate 308 to one of the pair of inner coupling support plates 305.

As shown in FIG. 13, outer support plate 308 has on its upper portion a groove 311 in which top pressure roller 350 is slidably engaged. Groove 311 has a radius of curvature equal to the distance between a rotational shaft 105 (shown in FIG. 1) and the center of groove 311. Outer coupling support plate 308 also has an oblong shaped hole 313 permitting vertical movement of intermediate pressure roller 355 and bottom pressure roller 358. Outer coupling support plate 308 also includes an opening 317 in which sleeve 395, an application sleeve 397 and an application spring 485 are free to move about in a substantially linear reciprocating path.

Referring once again to FIG. 1, by turning top frame 102 until a foot 103 thereof abuts the interior bottom surface of bottom frame 104, apparatus 100 can be swung open pivoting about shaft 105 in a direction denoted by arrow X. Apparatus 100 is maintained in an open position by a spring 106 which serves to push top frame 102 in an upwardly direction.

With apparatus 100 in this an open position, lever 381 as shown in FIG. 10 is turned clockwise causing rotation of pin 375 in an inwardly direction resulting in the inwardly rotational movement of shaft 360. Since collar 363 is in engagement with shaft 360 through connection of pin 366 in the groove of collar 363, collar 363 also moves inwardly. Slide pins 372 which are coupled to collar 363 through plate 369 slide inwardly and away from outer coupling support plate 308. Accordingly, pins 372 no longer hold outer support plate 308 to inner coupling support plate 305. Therefore as apparatus 100 is opened, inner support plate 305 which is coupled to top frame 102 and top pressure roller 350 connected to support plate 305 are separated from the rest of developing device 300. When apparatus 100 is closed in a direction denoted by arrow X', however, lever 381 is turned in a clockwise position such that during pressure developing, inner coupling support plate 305 is coupled to outer coupling support plate 308 through pins 372.

Apparatus 100 also includes a detection system which can determine when the beginning/top end of receiving medium 140 is being superposed by photosensitive medium 115, that is, at the time that photosensitive medium 115 and receiving medium 140 are about to be inserted between top pressure roller 350 intermediate pressure roller 355. In response to such detection, a motor 405, shown in FIG. 14, is activated, such that application shaft 390 begins to revolve through a reduction gear train 410.

Figure 11A:
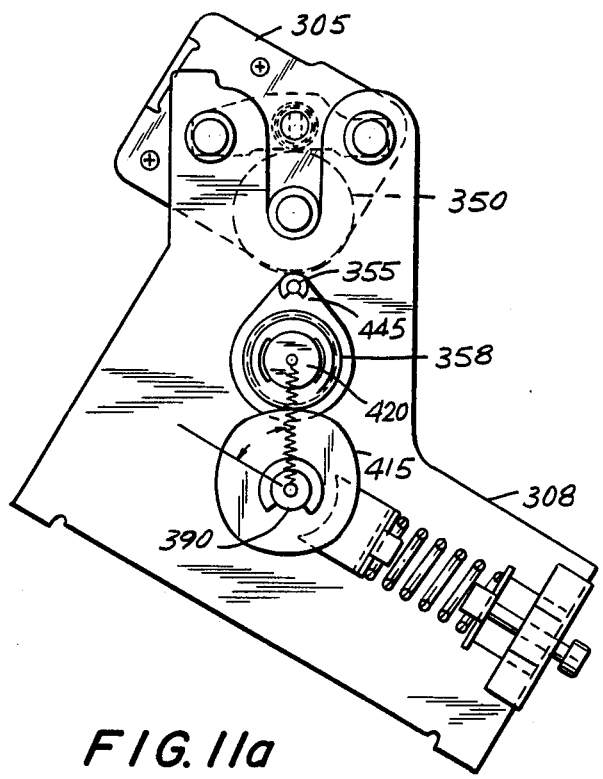
FIG. 11a is a front elevational view of the pressure developer of FIG. 9.
Figure 11B:
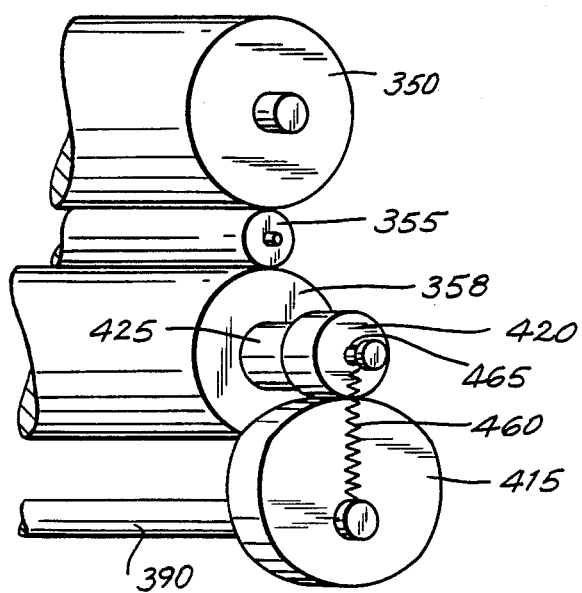
FIG. 11b is a perspective view of the pressure rollers in the pressure developer of FIG. 9.

As shown, in FIGS. 9, 11(a) and 11(b), rotation of application shaft 390 causes a pressure cam 415, which is mounted on application shaft 390, to rotate. Pressure cam 415 during that portion of its rotation toward its top dead center position pushes upwardly against a cam follower 420. A shaft 425 connects cam follower 420 to bottom pressure roller 358. Thus, as cam follower 420 is pushed upwardly, bottom pressure roller 358 is pushed upwardly against intermediate pressure roller 355. As a result, photosensitive medium 115 and receiving medium 140 are pressed between top pressure roller 350 and intermediate pressure roller 355 whereby an image is transferred to and formed on receiving medium 140 from photosensitive medium 115.

As pressure cam 415 reaches its top dead center position a detector 430 having subdetectors 431 and 432 is contacted by a cam switch 435 and outputs a signal which causes motor 405 to stop. Accordingly, top pressure roller 350 and intermediate pressure 355 continue to press against photosensitive medium 115 and receiving medium 140, respectively, ensuring the complete formation of an image on receiving medium 140.

The feed speed of photosensitive medium 115 and receiving medium 140 is controlled using the output of an encoder (not shown) which is attached to a drive motor 440 (shown in FIG. 3). A DC servo motor, step motor, AC motor or the like can be used for drive motor 440.

Upon detection by detector 430 of the bottom/end of receiving medium 140, motor 405 is once again activated causing application shaft 390 to once again rotate. Revolution of application shaft 390 in turn causes revolution of cam 415 toward its bottom dead center position. Cam follower 420, bottom pressure roller 358 and intermediate pressure roller 355 thus move downwardly. As pressure cam 415 reaches its bottom dead center position, intermediate pressure roller 355 moves completely out of contact with receiving medium 140. Photosensitive medium 115 is no longer pressed against receiving medium 140. Advantageously, by removing all pressure to receiving medium 140 after the image has been formed thereon, the possibility of inadvertently forming images on undesired areas of receiving medium 140 is eliminated.

As shown in FIG. 11(a), intermediate pressure roller 355 and bottom pressure roller 358 are coupled to each other through a coupling plate 445. Coupling plate 445 provides linear reciprocating movement of intermediate pressure roller 355 and bottom pressure roller 358. As illustrated in FIG. 9, bottom pressure roller 358 and application shaft 390 have connected to each of their ends spring holders 450 which engage springs 455.

As shown in FIG. 11(b), a spring 460 is connected to an end of application shaft 390 and a protrusion 465 extending from the face of cam follower 420. Spring 460 pulls cam follower 420 towards pressure cam 415 such that cam follower 420 maintains contact with pressure cam 415.

Figure 12:
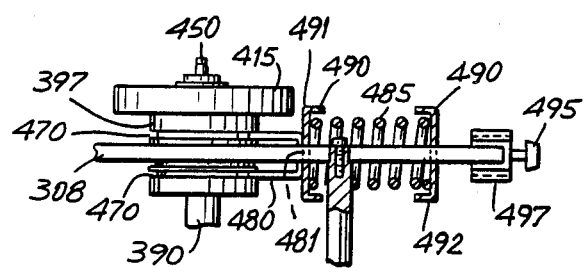

Referring to FIGS. 9 and 12, adjacent to the interior face of pressure cam 415, are a pair of grooves 470 on application sleeve 397. Sleeve 395 of application sleeve 397 is interposed between the pair of grooves 470. A bearing 475 is disposed between sleeve 395 and application sleeve 397. A spring receiver 480 fits within grooves 470. A cylindrical projecting portion (not shown), which is formed on a central external surface 481 of application spring receiver 480, fits within an application spring 485 to guide the inside diameter of the latter. Application spring 485 serves as a source of pressure pushing against spring receiver 480 which is transmitted to pressure cam 415. Application spring 485 is housed within an application spring restrainer 490 having brims 491 and 492. Brim 491 abuts surface 481 of application spring receiver 480. Both brim 491 and brim 492 of application spring restrainer 490 serve substantially as covers for and abut application spring 485. A cylindrical portion formed on interior surface of brim 492 of application spring restrainer 490 fits within the inside diameter of application spring 485 to maintain and guide spring 485 within restrainer 490.

A pressure adjustment screw 495, located on a distal end of outer coupling support plate 308, can be rotated to push a plate 497 into engagement with brim portion 492 of application spring restrainer 490. Plate 497 is slideably attached to outer support plate 308. By adjusting pressure adjustment screw 495, the amount of force exerted by plate 497 against application spring 485 and transmitted to pressure cam 415 can be properly adjusted. Consequently, the upward pressure transmitted by pressure cam 415 through cam follower 420 and bottom pressure roller 358 to intermediate pressure 355 can be adjusted. Thus adjusting pressure screw 495 determines the amount of pressure which is to be exerted by intermediate pressure roller 355 against receiving medium 140.

Figure 15:
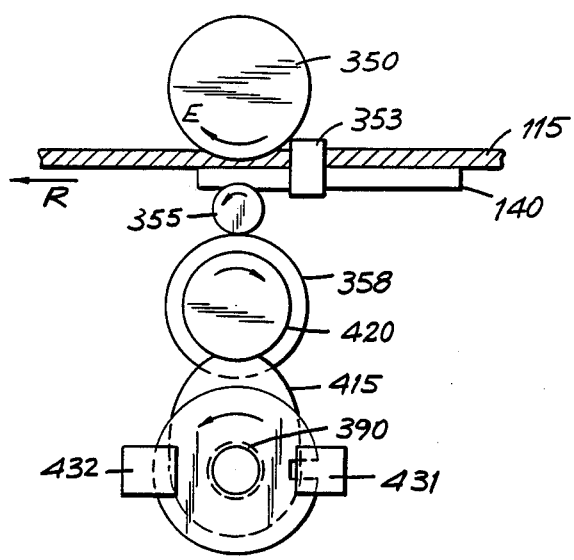
FIG. 15 is a diagrammatic front elevational view of the pressure developer of FIG. 9.

Referring now to FIG. 15, a detector 353 is provided which is located adjacent to intermediate pressure roller 355. Detector 353 is preferably a photocoupler wherein a light emitting element (such as a light emitting diode) and a light passive element (such a phototransistor) are incorporated as one unit and detect the difference in reflectance between surfaces of photosensitive medium 115 and receiving medium 140. Receiving medium 140 has a higher reflectance than photosensitive medium 115. Therefore, when the top end of receiving medium 140 passes detector 353 the higher reflectance is detected by the light-passive element of detector 353 and results in an increase in current flow therethrough. The change in current flow is detected by a control circuit (not shown) whereby motor 405 is energized. Intermediate pressure roller 355 will, as previously discussed, be pushed upwardly toward top pressure roller 350. The control circuit will deenergize motor 405 when cam 415 reaches its top dead center position. Similarly, when the end of receiving medium 140 is detected by less incident light striking the light-passive element of detector 353, motor 405 will once again be energized causing cam 415 to rotate to its bottom dead center position resulting in intermediate pressure roller 355 no longer exerting any pressure against receiving medium 140.

Figure 16:
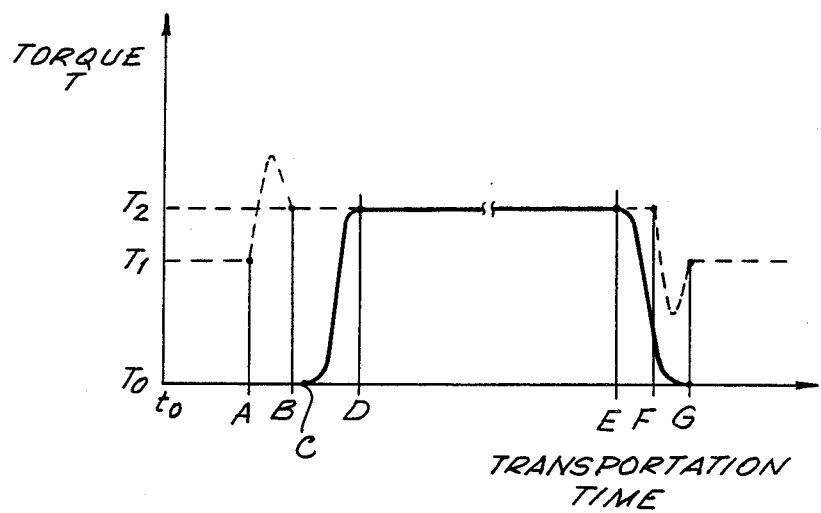
FIG. 16 is a graph plotting load versus transportation time of a prior art pressure developer and a pressure developer in accordance with the invention.
Figure 17:
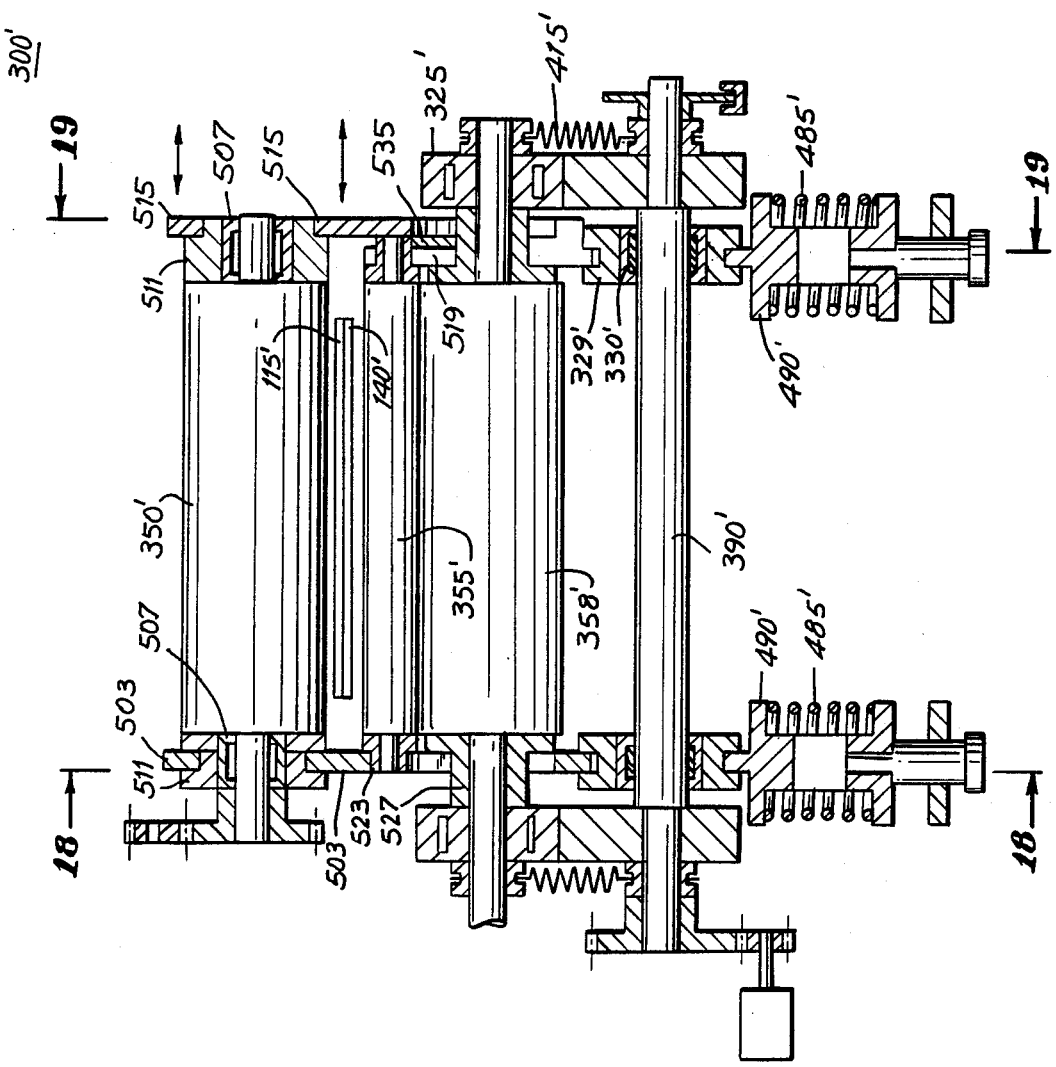
FIG. 17 is a side elevation view partially in cross section of a pressure developer in accordance with an alternative embodiment of the invention.
Figure 18:
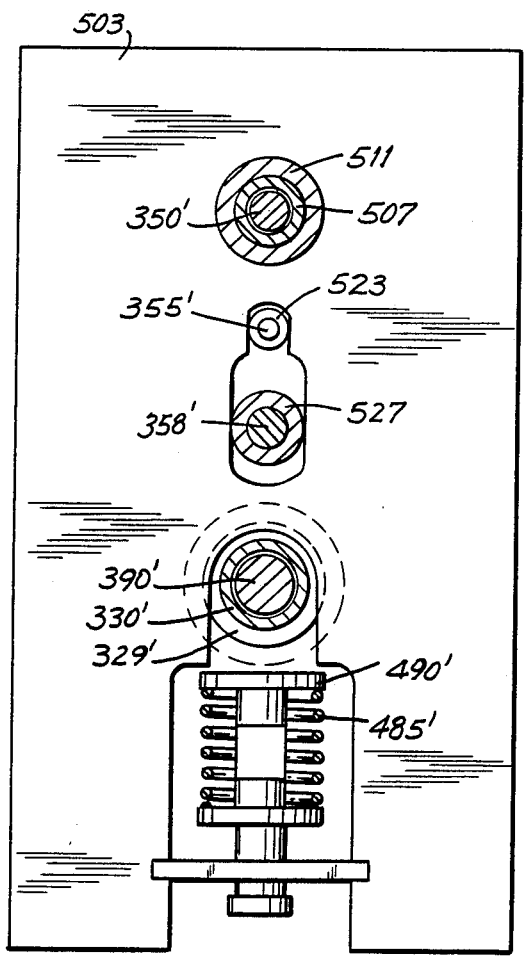
FIG. 18 is a front elevation view of the pressure developer taken along the line 18—18 of FIG. 17.
Figure 20:
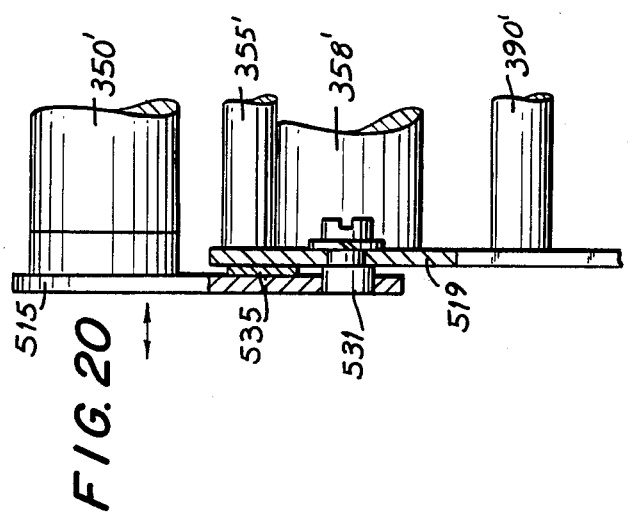
FIG. 20 is a side elevational view of the rollers of the pressure developer taken along line 20—20 of FIG. 19.
Figure 19:
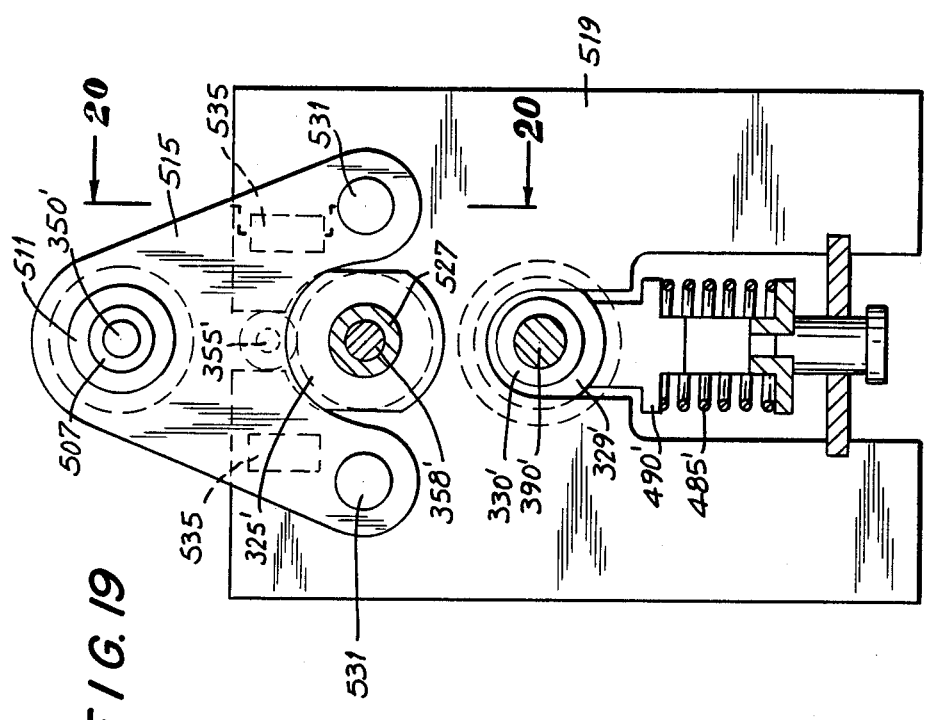
FIG. 19 is a rear elevational view of the pressure developer taken along line 19—19 of FIG. 17.

FIG. 16, illustrates a plot of the torque generated by pressure developer 300 and specifically intermediate roller 355 versus the position of receiving medium 140. The solid line represents the pressure developed by pressure developing device 300 whereas the dashed line represents the pressure developed by prior art pressure developers. Motor 440 is used to help feed receiving medium 140 through pressure developing device 300 through rotation of roller 150 and to rotate top pressure roller 350 by controlling the movement of photosensitive medium 115. The points shown along the transportation time axis represent:

Point $t_0$—the top end of receiving medium 140 reaches detector 353.

Point A—The top end of receiving medium 140 is first bitten by top pressure roller 350 and intermediate pressure roller 355.

Point B—The bite of the top end of receiving medium 140 by top pressure roller 350 and intermediate pressure roller 355 is complete.

Point C—Motor 440 starts to advance photosensitive medium 115.

Point D—Motor 440 stops. Pressure cam 415 has reached its top dead center position and the notch of cam switch 435 comes into contact with subdetector 431 of detector 430.

Point E—The bottom end of receiving medium 140 reaches detector 353. Motor 440 starts again.

Point F—The bottom end of receiving medium 140 starts to be fed out from top pressure roller 350 and intermediate pressure roller 355.

Point G—The bottom end of receiving medium 140 is completely fed out from top pressure roller 350 and intermediate pressure roller 355. Pressure cam 415 has reached its bottom dead center position and the notch of cam switch 435 comes into contact with subdetector 432 of detector 430.

Since intermediate pressure roller 355 is moved downwardly away from contact with receiving medium 140 except between points C-G of FIG. 16, no torque generated by the pressure developing device 300 exists until point C. Prior art pressure developing devices, however, impose a load/torque from the time of point A equal to torque $T_1$. Apparatus 100, however, slowly generates a torque beginning at point C until reaching a maximum torque at point D representing the top dead center position of pressure cam 415. In contrast thereto, prior art pressure developing devices generate a sharp torque change occurring between points A-B and continue to be maintain torque $T_2$ through point F. From point E, however, apparatus 100 begins to decrease the torque being generated until at point G (representing the bottom dead center position of pressure cam 415) the initial torque of $T_0$ is once again reached. The sudden change in torque from points E-G generated by prior art pressure developing devices is never produced by apparatus 100. Prior art pressure developing devices also never reach a torque of $T_0$ and therefore undesirably continue to generate relatively high torque levels of $T_1$ or greater.

Pressure developer 300 is able to refrain from generating such high torque values by maintaining a space between top pressure roller 350 and intermediate pressure roller 355 at all times except when actually transferring the image from photosensitive medium 115 to receiving medium 140. Additionally, by providing such spacing apparatus 100 also prevents the surface of intermediate pressure roller 355 from being smeared due to intermediate pressure roller 355 applying pressure and breaking microcapsules of photosensitive medium 115 which are not part of the image to reproduced.

Since pressure is not applied to areas except for the image formation area, no microcapsules on nonpressed areas of photosensitive medium 115 are broken. Separation of receiving medium 140 from photosensitive medium 115 after receiving medium 140 travels beyond pressure developing device 300 is therefore facilitated. Apparatus 100 also prevents a sudden change in torque at the time that receiving medium 140 (i) first comes into contact with intermediate pressure roller 355 (i.e., sheet biting time) and (ii) finishes coming into contact with intermediate pressure roller 355 (sheet feeding out-time). Since the maximum torque produced by developing device 300 can be decreased, the load imposed on drive motor 440 also can be reduced. Additionally, since top pressure roller 350 is separated from intermediate pressure roller 355 after receiving medium 140 travels past intermediate pressure roller 355, no noise or shock is produced which would otherwise result from the impact of intermediate pressure roller 355 with top pressure roller 350. Due to the separation between top pressure roller 350 and intermediate pressure roller 355, photosensitive medium 115 is also prevented from being damaged by the impact of these two pressure rollers with each other. Pressure developing device 300 also provides a highly stable method of transporting receiving medium 140 therethrough substantially reducing the likelihood of wrinkling receiving medium 140, slanting the path along which receiving medium 140 travels of jamming developing device 300.

Photosensitive medium 115 travels in a path within top frame 102 whereas receiving medium 140 travels in a path within bottom frame 104. Accordingly, in the event that receiving medium 140 does become wrinkled or slanted in its path of travel or jams developing device 300, by opening apparatus 100 any problems in the feeding system of receiving medium 140 can be easily determined and corrected. Maintenance of apparatus 100 is also advantageously facilitated by providing the paths of photosensitive medium 140 in different frames of apparatus 100.

Referring now to FIGS. 17-20, an alternative pressure developing device 300 is disclosed wherein elements similar to those previously described are indicated by like reference numerals followed by an apostrophe (e.g., top pressure roller 350').

One end of a top pressure roller 350' is rotatably exposed within a groove on an upper portion of a support plate 503 through a bearing 507 and fixing ring 511. The other end of top pressure roller 350' is rotatable and detachable exposed within a groove on the upper portion of a coupling support plate 515 through another bearing 507 and another fixing ring 511.

Intermediate pressure roller 355' is disposed at a vertically lower level than top pressure roller 350'. Both ends of intermediate pressure roller 350' are rotatable, vertically movably within and engage support plate 503 and a support plate 519 through bearings 523. A bottom pressure roller 358' is disposed in a vertically lower position than intermediate pressure roller 355' and has both of its ends rotatable and vertically movably and in engagement with support plates 503 and 519 through another pair of bearings 527.

The upper portion of coupling support plate 515 holds fixing ring 511 which fits about an end of top pressure roller 350'. The lower portion of coupling support plate 515 holds a pair of guide pins 531 which extend through and are detachably secured to support plate 519 by a pair of stationary magnets 535. Coupling support plate 515 also includes a semicircular notched portion so as to provide sufficient clearance from cam follower 325'. Cam follower 325' is mounted to bottom pressure roller 358' and can be easily detached therefrom. Support plates 503 and 515 provide the necessary support for top pressure roller 350' to press against photosensitive medium 115. Application shaft 390' is rotatably engaged to support plate 503 and to support plate 519 through shaft receivers 330' on sleeves 329'.

In order to insert photosensitive medium 115 into apparatus 100 or to remove photosensitive medium 115 from apparatus 100, coupling support plate 515 is detached from coupling support plate 519 so that top pressure roller 350' is supported at only one end thereof by the coupling support plate 503. Photosensitive medium 115 now can be easily inserted between or removed from the longitudinal side surface of top pressure roller 350'. During insertion or removal of photosensitive medium 115 from apparatus 100, a gap between intermediate pressure roller 355' and top pressure roller 350' exists for further facilitating insertion of photosensitive medium 115 into or removal of photosensitive medium 115 from apparatus 100. The operation of pressure developing device 300' is otherwise the same as previously described for pressure developing device 300.

Figure 21:
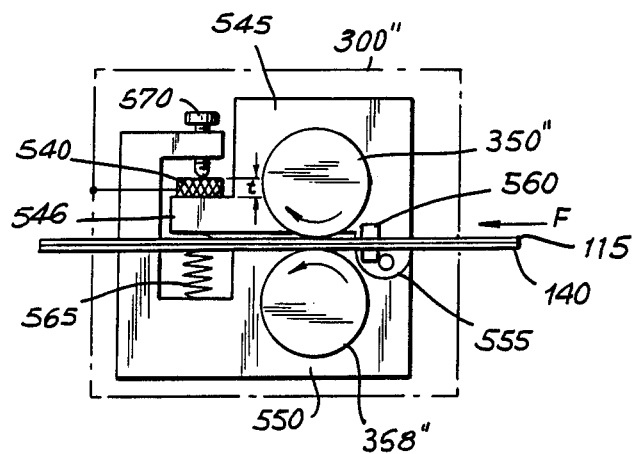
FIG. 21 is a diagrammatic front elevational view of a pressure developer in accordance with a further embodiment of the invention.

An alternative pressure developing device 300'', shown in FIG. 21, includes piezoelectric actuator 540, a top frame 545, which is pivotably mounted to a bottom frame 550 about a fulcrum 555, a detector 560 and a spring 565. Device 300'' also includes a top pressure roller 350'' which is rotatably mounted to top frame 545 and a bottom pressure roller 358'' which is rotatably mounted to bottom frame 550. Top pressure roller 350'' and bottom pressure roller 358'' are similar to top pressure roller 350 and bottom pressure roller 358. Piezoelectric actuator 540 sits on a leg 546 of top frame 545. Detector 560 is positioned between fulcrum 555 and bottom pressure roller 358''. Top pressure roller 350'' and bottom pressure roller 358'' are separated by a distance t which is larger than the combined thickness of photosensitive medium 115 and receiving medium 140.

Prior to reaching detector 560, photosensitive medium 115 and receiving medium 140 are joined together and travel in a path in a direction denoted by arrow F. Following the lapse of a predetermined period of time after the top/beginning of receiving medium 140 is detected by detector 560, a predetermined voltage is applied to piezoelectric actuator 540. The original size t of piezoelectric actuator 380 increases due to this applied voltage. Since the original size of piezoelectric actuator 380 is approximately the same as the original spacing between top pressure roller 350'' and bottom pressure roller 358'', by increasing the size of piezoelectric actuator 540, top frame 545 pivots downwardly decreasing the spacing between top pressure roller 350'' and bottom pressure 358''.

The pressure exerted by piezoelectric actuator 540 and transmitted to top pressure roller 350'' and bottom pressure roller 358'' forces photosensitive medium 115 against receiving medium 140 thereby transferring the image from photosensitive medium 115 to receiving medium 140. The amount of pressure exerted by top pressure roller 350'' and bottom pressure roller 358'' also can be preadjusted through an adjusting screw 570. Adjusting screw 570 is threaded through a hole at the distal end of bottom frame 550. By tightening down screw 570 onto piezoelectric actuator 540, the spacing between top pressure roller 350'' and bottom pressure roller 358'' can be preadjusted so as to provide the desired pressure between top pressure roller 350'' and bottom pressure roller 358'' upon application of the predetermined voltage to piezoelectric actuator 540.

When the bottom end of receiving medium 140 reaches detector 560, the voltage applied to piezoelectric actuator 540 is removed resulting in piezoelectric actuator 540 returning to its initial size t. The spacing between top pressure roller 350'' and bottom pressure roller 358'' also returns to its initial spacing of size t through spring 565 pushing leg 546 of top frame 545 upwardly.

Figure 22:
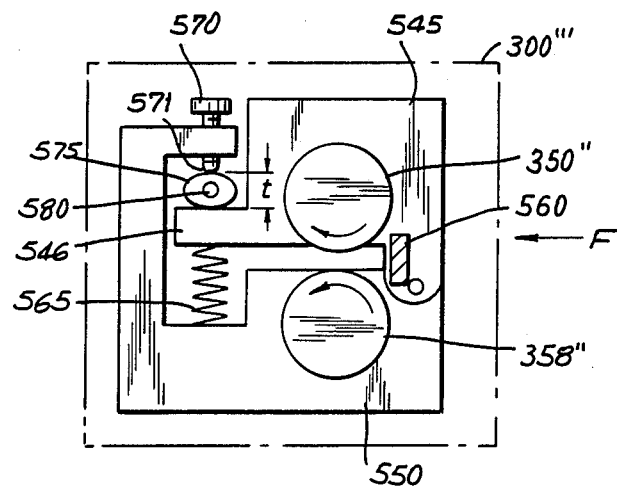
FIG. 22 is a diagrammatic front elevational view of a pressure developer in accordance with yet another embodiment of the invention.

Another alternative pressure developing embodiment is shown in FIG. 22. Device 300''' includes many of the same elements shown in FIG. 21 as indicated by like reference numerals. Device 300''', however, includes an eliptical cam 575 whose distance t between a distal end 571 of screw 570 and leg 546 of top frame 545 varies between its long axis distance "a" and its short axis distance "b". Cam 575 rotates about a shaft 580. Operation of device 300''' is similar to device 300'' of FIG. 21 except that upon detection of the beginning or end of receiving medium 140, eliptical cam 575 will rotate from its original position where distance t is equal to the length of its short axis distance "b" to the length of its long axis distance "a". The center of eliptical cam 575 is stationary. Shaft 580 is rotationally driven by a motor (not shown) through a gear train (not shown). Rotation of this motor is set in such a manner as to be reduced in speed by the gear train. Similar to device 300'', prior to rotating cam 575 such that distance t equals "a", the distance separating top pressure roller 350'' and intermediate pressure roller 355'' is larger than the combined thicknesses of photosensitive medium 115 and receiving medium 140. When distance t equals the length of long axis distance "a", sufficient pressure is exerted between top pressure 350'' and bottom pressure roller 358'' to transfer the image from photosensitive medium 115 to receiving medium 140.

Other methods for breaking nonhardened or softened microcapsules on photosensitive medium 115 also can be used in lieu of pressure developing device 300. For example, the microcapsules can be struck with an accelerated hammer. Softened microcapsules also can be broken by directing supersonic waves of energy thereat wherein the vibrational energy of the supersonic waves is adjusted such that only softened microcapsules are broken.

Structure of the Pressure Rollers

In order to properly break/destroy the microcapsules on photosensitive medium 115, a predetermined load for a predetermined unit of area must be exerted by the pressure rollers on photosensitive medium 115. In order to reduce the load which must be generated by the pressure rollers, the contact area between the pressure rollers is reduced. Preferably, the diameter of the pressure portion of at least one of the two pressure rollers in contact with the pressure receiving materials should be minimized. For example, prior art developing devices using (i) size A4 paper having a sheet width of approximately 210 millimeters and a thickness of approximately 115 micrometers as receiving medium 140, (ii) a photosensitive medium having a thickness of approximately 30 micrometers, and (iii) two pressure rollers having diameters of approximately 40 millimeters each must generate a load of approximately 1400 kg/width of A4 sheet (210 millimeters) to properly transfer the image from photosensitive medium 115 to receiving medium 140. In contrast, thereto, with top pressure roller 350, intermediate pressure roller 355 and bottom pressure roller 358 having diameters of 40 millimeters, 5 millimeters and 40 millimeters, respectively, the load necessary to transfer the image from photosensitive medium 115 to receiving medium 140 is only 600 kg/width of A4 sheet (210 millimeters). Reduction in the diameter of intermediate pressure roller 355 from 40 millimeters to 5 millimeters results in a load less than half that required for prior art pressure rollers having diameters of 40 millimeters each.

Preferably, the diameter of at least one of the pressure rollers in contact with the pressure receiving materials should range between 3 millimeters to 15 millimeters in order to maintain a high quality image. Where top pressure roller 350, intermediate pressure roller 355 and bottom pressure roller 358 have diameters of 40 millimeters, 3 millimeters and 40 millimeters, respectively, a load of only 400 kg/width of A4 sheet (210 millimeters) is required to properly form the image on receiving medium 140 which is less than one-third the load required for comparable prior art pressure developers. Where the diameter of intermediate pressure roller 355 is less than 3 millimeters, receiving medium 140 can become wrinkled, its path through pressure developing device 300 slanted or can jam pressure developed device 300. It has also been found that for diameters of intermediate pressure roller 355 of less than 3 millimeters, pressure developing device 300 are unable to apply a continuous stable load on the pressure receiving materials (i.e., photosensitive medium 115 and receiving medium 140) resulting in a reduction in the image quality. The inability to apply a continuous stable load is due to the variation in the precision of parts used for developing device 300 when coupled with slight movement of apparatus 100 during formation of the image onto receiving medium 140.

When top pressure roller 350, intermediate pressure roller 355 and bottom pressure roller 358 have diameters of 40 millimeters, 15 millimeters and 40 millimeters, respectively, a load of approximately 900 kg/width of A4 paper (210 millimeters) is required to properly form an image on receiving medium 140 which is less than ¾ of the load required by prior art pressure rollers. For diameters of intermediate pressure roller 355 greater than 15 millimeters but less than 40 millimeters, load reductions compared to prior art pressure rollers also have been achieved.

Pressure rollers of developing device 300 are preferably made from SK4 material or S45C material. These materials are processed using lathe-machinery to obtain a predetermined size which ensures that a hardness of HRC 60-65 is obtained after thermal treatment thereto. The pressure rollers are then finished to have a surface roughness of Rmax equal to 3.5–5.0 micrometers and a cylindricity of approximately 15 micrometers through an abrasion process. Cylindricity as used herein means the error of roundness of the roller. Further discussion concerning the SK4 and S45C materials can be found in the Japanese Industrial Standard (JIS), Section 24. Table 1 below sets forth the composition of these materials:

TABLE 1

| Composition | Carbon tool steel SK4 (JIS) | Tool Steel for machine structure S45C (JIS) |
|---|---|---|
| C | 0.90–100% | 0.42–0.48 |
| Si | 0.35 | 0.15–0.35 |
| M | 0.50 | 0.60–0.90 |
| P | 0.030 | 0.030 |
| S | 0.030 | 0.030 |

A hard chrome plated layer of 50 micrometers is next applied to the material and then the thickness of the hard chrome plated layer is reduced to 40 micrometers through another abrasion process. As a result, the surface of the hard chrome plated layer is uniformly smooth. The hard chrome plate layer is required for improving the wear resistance and damage resistance of the pressure rollers.

Materials having a hardness of less than HRC 60 have poor damage resistance levels and materials with hardnesses of greater than HRC 65 are prone to cracking. Surface roughnesses of less than Rmax equal to 3.5 micrometers do not affect the image quality formed on receiving medium 140 but are more costly to manufacture. For pressure rollers having surface roughnesses greater than Rmax equal to 5.0 micrometers, the pressure applied by the pressure rollers against the microcapsules of photosensitive medium 115 is not uniformly distributed. The uneven application of pressure is due to the diameter of each microcapsule being of the same magnitude (i.e., approximately 3 to 10 micrometers) as the roughness of the pressure roller. Consequently, at least some microcapsules which need to be broken are not broken which affects the quality of the image formed on receiving medium 140. The pressure rollers also should have a cylindricity of approximately 15 micrometers based on this same rationale.

Intermediate pressure roller 355 must uniformly press against receiving medium 140 in order to properly form an image on the latter. In order to provide such uniform pressure, pressure cam 415 is rotated toward its top dead center position which forces bottom pressure roller 358 to press against intermediate pressure roller 355. That portion of bottom pressure roller 358 which contacts intermediate pressure roller 355 must therefore be shaped so that intermediate pressure roller 355 uniformly presses against receiving medium 140. In determining the shape of that portion of bottom pressure roller 358 which is in contact with intermediate pressure roller 355, reference now should be had to FIGS. 23–25.

Figure 23:
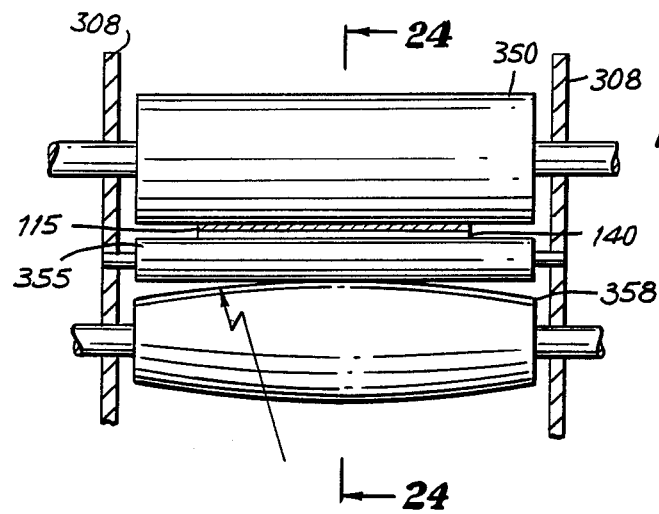
FIG. 23 is a side elevational view of a pair of pressure rollers prior to insertion of the pressure receiving materials therebetween.
Figure 24:
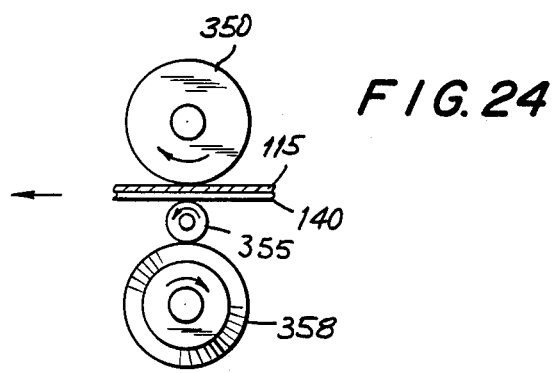
FIG. 24 is a cross-sectional view of the rollers taken along line 24—24 of FIG. 23.

As shown in FIGS. 23 and 24, prior to the insertion of photosensitive medium 115 and receiving medium 140 between top pressure 350 and intermediate pressure roller 355, no deformation of top pressure roller 350, intermediate pressure roller 355 or bottom pressure roller 358 occurs. During the pressure development period (i.e., as photosensitive medium 115 and receiving medium 140 travel between top pressure roller 350 and intermediate pressure roller 355), deformation of top pressure roller 350, intermediate pressure 355 and bottom pressure roller 358 occurs. Top pressure roller 350, which serves as a drive shaft for photosensitive medium 115 and receiving medium 140, has an area of contact with photosensitive medium 115 equal to an area formed by a diameter of approximately 40 millimeters. The portion of intermediate pressure roller 355 in contact with receiving medium 140 is equal to an area formed by a diameter of approximately 5 millimeters.

Figure 25:
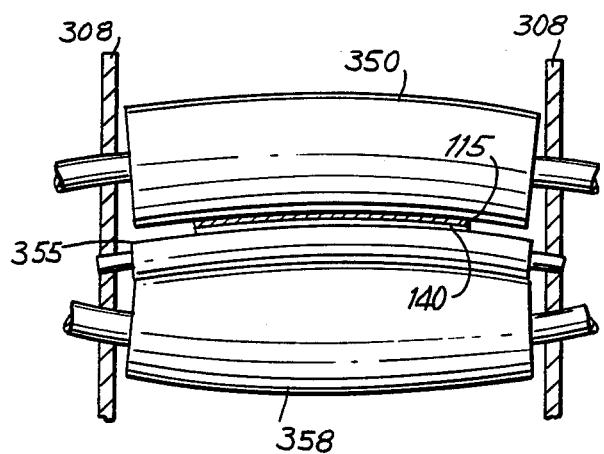
FIG. 25 is a side elevational view of a pair of pressure rollers with the pressure receiving materials inserted therebetween.

Bottom pressure roller 358 which has a curvature R has a maximum outside diameter of approximately 40 millimeters. As shown in FIG. 25 during deformation of intermediate pressure roller 355, bottom pressure roller 358 serves to support and prevent unacceptable deformation of intermediate pressure roller 355. Curvature R of bottom pressure roller 358 is calculated by taking into account the amount of deformation which can be tolerated by top pressure roller 350 and intermediate pressure roller 355 and which will nevertheless allow for a uniform distribution of pressure to be applied to photosensitive medium 115 and receiving medium 140 by these two rollers.

Figure 26A:
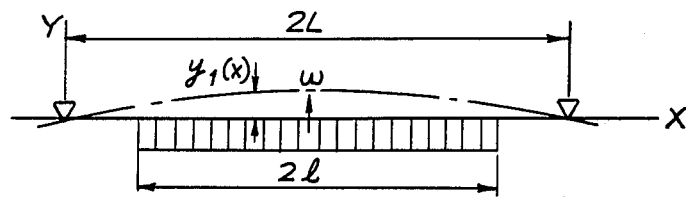
FIG 26a is a pressure diagram of a top pressure roller during pressure development.

FIG. 26a illustrates conceptually a pressure diagram of top pressure roller 350. Top pressure roller 350 is deformed by displacement in a direction indicated by $Y_{1(x)}$ and is shown by the dash-dot line. The distance along top pressure roller 350 is represented by a distance x. As load is applied to top pressure roller 350 by intermediate pressure roller pushing upwardly, the load is transmitted through top pressure 350 to and is equally divided by support plates 305.

Figure 26B:
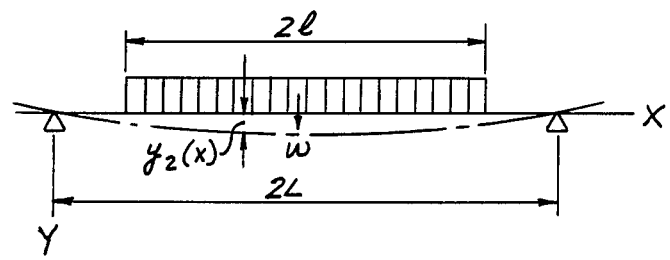
FIG. 26b is a pressure diagram of a intermediate pressure roller during pressure development.

FIG. 26b illustrates conceptually the pressure diagram of intermediate pressure roller 355. Deformation of intermediate pressure roller 355 is represented by displacement $Y_{2(x)}$ and is shown by a dot-dash line. The length along intermediate pressure roller 355 is represented by x. The arrows in FIGS. 26a and 26b denoted by "w" represent the equally distributed load. The distance between the two fulcrums for top pressure roller 350 and intermediate pressure 355 are represented by the length "2L". The width of receiving medium 140 is represented in FIGS. 26a and 26b by length "2l".

Figure 26C:
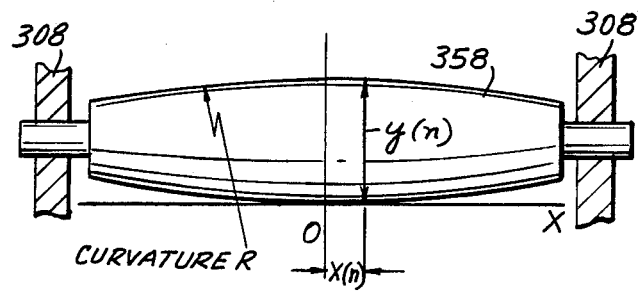
FIG. 26c is a front elevational view of a bottom pressure roller.

As shown in FIG. 26c, bottom pressure roller 358 is configured having a curvature R based on the deformations shown in FIGS. 26a and 26b of top pressure roller 350 and intermediate pressure roller 355, respectively. Displacement of the outside diameter y(n) of bottom pressure roller 358 and the length x(n) from the center of bottom pressure roller 358 has been calculated based on a curvature R having a value of 62,600. By providing top pressure roller 350, intermediate pressure roller 355 and bottom pressure roller 358 in accordance with the conditions set forth below in Table 2, bottom pressure roller 358 will uniformly support and ensure that top pressure roller 350 and intermediate pressure roller 355 uniformly press against the width of receiving medium 140.

TABLE 2

| x(n) mm | y(n) mm | Curvature Rmm | Note |
|---|---|---|---|
| 0.0 | 40.000 | approximate value: | calculation condition: |
| 10.0 | 39.998 | | E (Young's modules): $2.1 \times 10^4$ kgf/mm$^2$; |
| 20.0 | 39.993 | 62,600 | w (equally distributed |
| 30.0 | 39.984 | | load): 3.7 kgf/mm; |
| 40.0 | 39.971 | | D1 (top pressure roller |
| 50.0 | 39.956 | | diameter): 40 mm; |
| 60.0 | 39.932 | | D2 (intermediate pressure |
| 70.0 | 39.916 | | roller diameter): 5 mm; |
| 80.0 | 39.891 | | D3 (bottom pressure roller |
| 90.00 | 39.865 | | diameter): 40 mm; |
| 100.00 | 39.837 | | 2L (distance between |
| 110.00 | 39.808 | | fulcrums): 256 mm; and |
| 115.00 | 39.793 | | 2l (sheet width): 216 mm |

Figure 27:
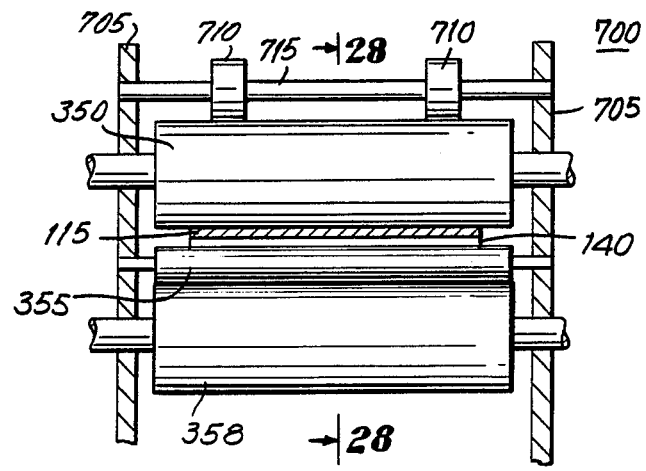
FIG. 27 is a side elevational view of a pressure developer in accordance with another alternative embodiment of the invention.
Figure 28:
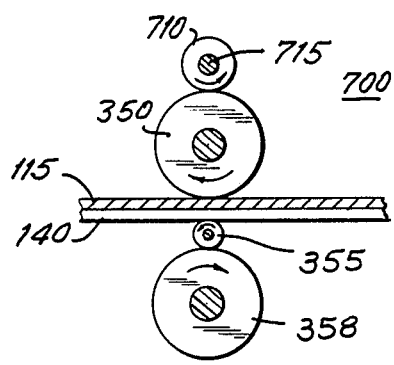
FIG. 28 is a cross-sectional view of the rollers taken along line 28—28 of FIG. 27.

FIGS. 27 and 28 illustrate an alternative pressure developing device 700 in which elements similar to those previously described are identified by like reference numerals. Pressure developing device 700 includes top pressure roller 350, intermediate pressure roller 355 and bottom pressure roller 358. Top pressure roller 350 serves as a shaft drive and has a portion in contact with photosensitive medium 115 having an area equal to a diameter of approximately 30 millimeters. The portion of intermediate pressure roller 355 which is in contact with receiving medium 140 has an area equal to a diameter of approximately 10 millimeters. That portion of bottom pressure roller 358 which is in contact with intermediate pressure roller 355 has an area equal to a diameter of approximately 19 millimeters.

Bottom pressure roller 358 is movable in a linear reciprocating manner with intermediate pressure roller 355 mounted thereon. Bottom pressure roller 358 thus serves to support intermediate pressure roller 355 to thereby restrain deformation of the latter. Support plates 705 support top pressure roller 350, intermediate pressure roller 355 and bottom pressure roller 358. Two additional rollers 710 are fixedly mounted on a support shaft 715 which is secured at its distal ends to support plates 705. Support shaft 715 and rollers 710 mounted thereon are positioned and dimensioned to rotatably contact and restrain the deformation of top pressure roller 350. Intermediate pressure roller 355 and top pressure roller 350 therefore apply a uniform distribution of pressure on photosensitive medium 115 and receiving medium 140.

The deformation curves of top pressure roller 350 and bottom pressure roller 358 of pressure developing device 700 substantially conform to each other. Preferably, for a receiving medium having a width of 210 millimeters, rollers 710 should be positioned approximately 44 millimeters from the center of top pressure 350. Pressure developing device 700 is otherwise similarly constructed as previously described and shown in FIGS. 23-25.

FIG. 29 illustrates another pressure developing device 720 in accordance with an alternative embodiment of the invention. Device 720 includes a top pressure roller 350, a bottom pressure roller 358 and two intermediate pressure rollers 355 and 356. Intermediate pressure roller 355 rotatably moves in a linear reciprocating manner by bottom pressure roller 358 rotatable pressing thereagainst. Intermediate pressure roller 356 is rotatably supported by top pressure roller 350. Device 720 provides a uniform distribution of load applied to photosensitive medium 115 and receiving medium 140.

Device 720 can be constructed with (i) portions of top pressure roller 350 and intermediate pressure roller 356 having areas of contact with each other defined by diameters, of approximately 40 millimeters and 10 millimeters, respectively and (ii) portions of intermediate pressure roller 355 and bottom pressure roller 358 having areas of contact with each other defined by diameters of approximately 10 millimeters and 40 millimeters, respectively. With device 720 constructed with such dimensions the load which needs to be generated to provide a uniform distribution of pressure on receiving medium 140 and photosensitive medium 115 is approximately one half the load necessary of comparable a pressure developing device having two pressure rollers each with a diameter of approximately 40 millimeters. Structure of device 700 is otherwise similar to that described in FIGS. 23-25 above.

The pressure developing device of the invention in each of the alternative embodiments described above includes at least one pressure roller having a smaller diameter than the other pressure rollers. Consequently, the pressure developing device used in the invention significantly reduces the load which needs to be generated. The reduction in load allows for a decrease in the rigidity of the pressure portion of each of the pressure rollers resulting in a pressure developing device of less weight and smaller size then presently commercially available. Accordingly, the pressure developing devices of the invention uniformly distribute the load which is imposed on photosensitive medium 115 and receiving medium 140 and provide a high quality image on receiving medium 140.

Pressure Development Speed

The speed at which photosensitive medium 115 and receiving medium 140 are transported through pressure developing device 300 is determined in part by the diameter of the pressure rollers in contact with photosensitive medium 115 and receiving medium 140 and the load to be generated by these pressure rollers. Tables 3 and 4 shown below tabularly list different speeds at which receiving medium 140 and photosensitive medium 115 travel between the pressure rollers. The pressure rollers tested were of three different diameters with various loads being generated by each. The value of each load is based on applying a uniform distribution of pressure across a sheet having a width of approximately 210 millimeters.

TABLE 3

| Pressure Roller Diameter (0) (in millimeters) | Speed (in mm/sec) | Load (in kgf/210 mm) |
| --- | --- | --- |
| 5 | (1) 10<br>(2) 20 | 600 |
| 10 | (1) 12.5<br>(2) 50 | 700 |
| 50 | (1) 15<br>(2) 100 | 1700 |

TABLE 4

| Pressure Roller Diameter (0) (in millimeters) | Speed (in mm/sec) | Load (in kgf/210 mm) |
| --- | --- | --- |
| 5 | (1) 1 | 300 |
| 10 | (1) 2.5 | 500 |
| 50 | (1) 12.5 | 1600 |

Both Tables 3 and 4 represent test results using two pressure rollers with equal diameters of 5, 10 or 50 millimeters. Pressure rollers of unequal diameters (e.g. 5 and 10 millimeters) produced substantially the same results in speed and load as pressure rollers having diameters both of which were equal to the smaller of the two unequal diameters (i.e. 5 millimeters).

As shown in Table 3, a feed speed of 10 millimeters per second using two pressure rolls each having a diameter of 5 millimeters can be achieved under loads equal to or greater than 600 kgf/210 millimeters. The optical reflection density achieved was equal to or greater than 2.0. As used herein, the optical reflection density which is defined as optical term A41 in the Japan Industrial Standard, incorporated herein by referenced thereto, defines a black surface as equal to 2.2. Accordingly, an optical reflection density equal to or greater than 2.0 provides an image with sufficient colored density. For a feed speed of approximately 20 millimeters per second between two pressure rollers having a diameter of 5 millimeters each under a load of 600 kg/210 millimeters, the optical reflection density is less than 2.0. Nevertheless, there is no unevenness in the color density of the image formed on the receiving medium.

Feed speeds of 12.5 and 15 millimeters/second between a pair of pressure rollers having diameters of 10 millimeters and 50 millimeters under loads of 700 and 1700 kgf/210 millimeter were achieved with optical reflection densities equal to or greater than 2.0, respectively. Feed speeds of 50 and 100 millimeters/second between a pair of pressure rollers having diameters of 10 and 50 millimeters under loads of 700 and 1700 kgf/210 millimeters were also achieved with optical reflection densities less than 2.0, respectively. No unevenness in the color density of the image formed on the receiving medium occurred.

Table 4 shows feed speeds at minimum loads generated by the pressure rollers. The optical reflective densities in Table 4 were equal to or greater than 2.0. No unevenness in the quality of the colored density in the image formed on the receiving medium occurred. For example, two pressure rollers having diameters of 5 millimeters each under a load of 300 kgf/210 millimeter formed on image on receiving medium 140 having no unevenness in the color density for feed speeds equal to or less than 1 millimeter/second.

Figure 31:
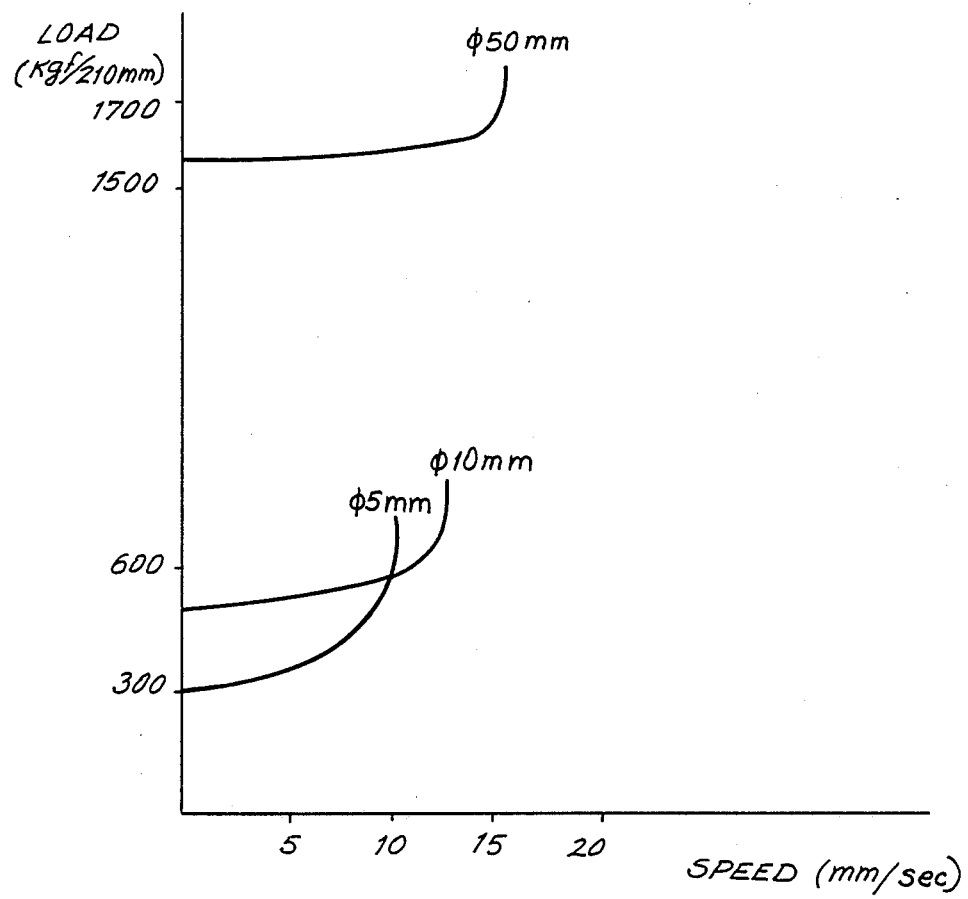
FIG. 31 is a graph plotting feed speed versus load generated by different size rollers in a pressure developer.
Figure 32:
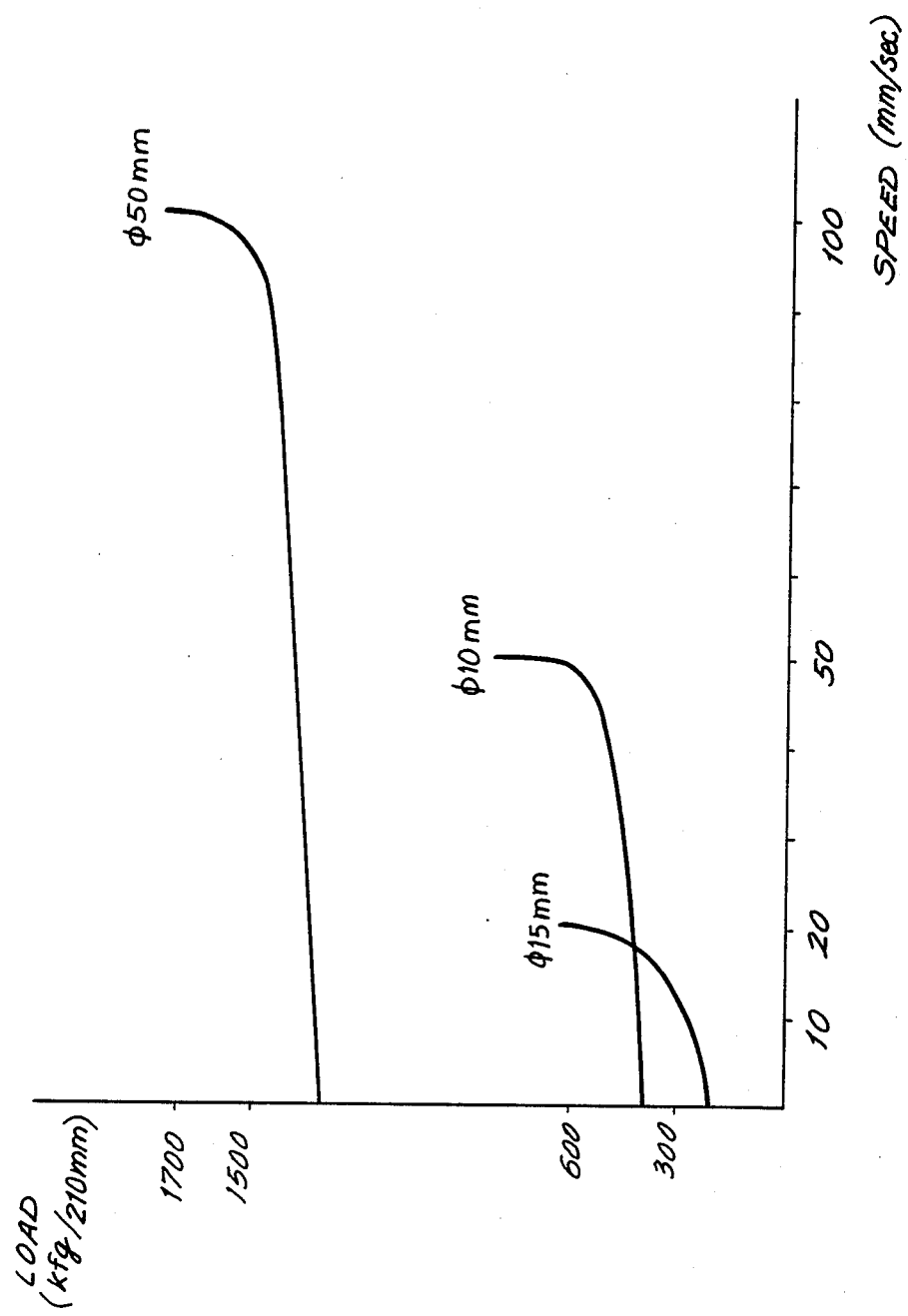
FIG. 32 is another graph plotting feed speed versus load generated by the rollers reported in FIG. 31 at different conditions.
Figure 33:
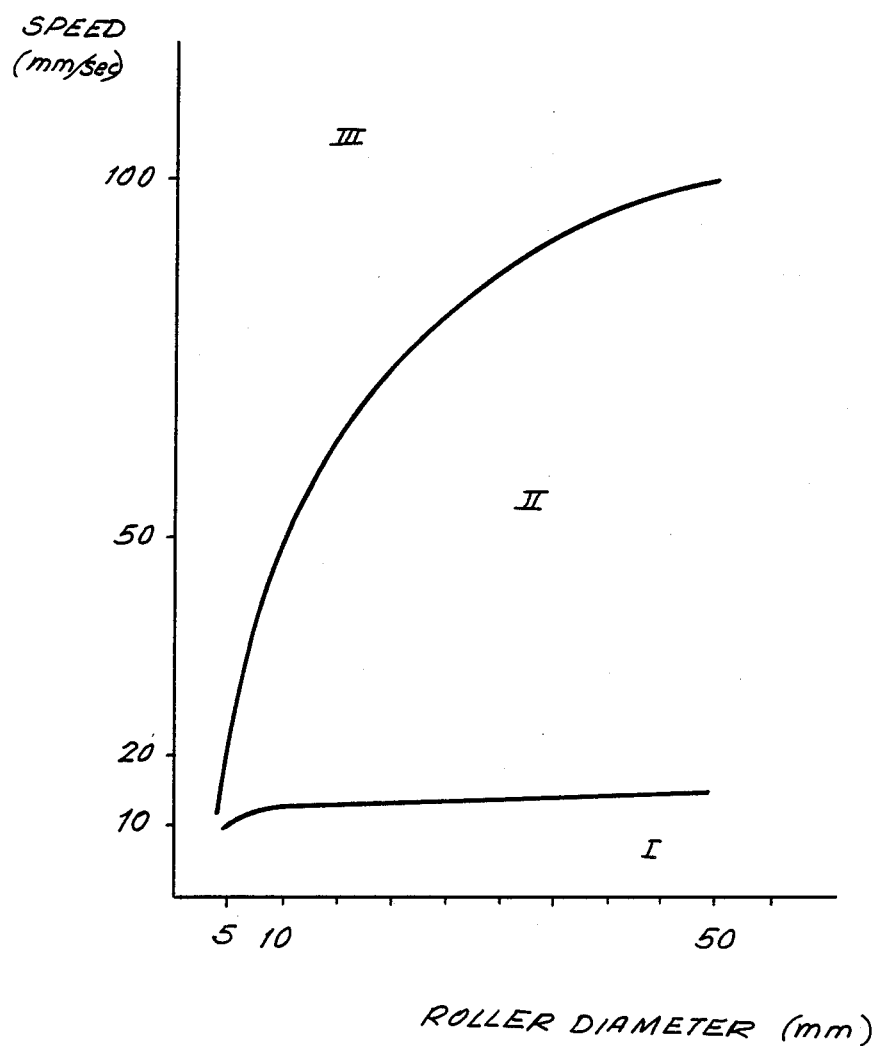
FIG. 33 is a graph plotting the diameter of a pressure roller versus feed speed of a pressure developer.

The test results shown in Tables 3 and 4 are illustrated graphically in FIGS. 31-33. FIG. 31 graphically shows the relationship between loads generated by the pairs of pressure rollers versus the feed speeds noted in Tables 3 and 4 by (1). Each of the curves in FIG. 31 ends in a sharp hyperbolic rise. In other words, loads may be increased without any appreciable change in the feed speeds. In order to achieve the optical reflection densities equal to or greater than 2.0, FIG. 31 illustrates that the substantially maximum feed speeds, irrespective of load, are 10, 12.5, and 15 millimeters/second for pairs of pressure rollers having diameters of 5, 10, and 15 millimeters, respectively.

FIG. 32 plots the relationship between the loads generated by a pair of pressure rollers having diameters of 5, 10 and 50 millimeters versus feed speed. Each of the curves shown in FIG. 32 also ends in a hyperbolic rise. Consequently, the loads may be increased without affecting feed speeds. In order to achieve an image quality without unevenness in the color density, the substantially maximum feed speeds, irrespective of load, are 20, 50, and 100 millimeters/seconds with the pairs of pressure rollers having diameters of 5, 10, and 50 millimeters, respectively.

FIG. 33 graphically plots the feed speed versus pressure roller diameter with the maximum load supplied to photosensitive medium 115 and receiving medium 140. Area 1 represents optical reflection densities equal to or greater than 2.0. Area 2 represents optical reflection densities less than 2.0. Images formed on receiving medium 140 in Area 2 have lighter colors than in Area 1. Images formed on receiving medium 140 in Area 3 have uneven color densities.

In view of the foregoing, photosensitive medium 115 and receiving medium 140 when sandwiched between and fed through a pair of pressure rollers can travel at a maximum speed of approximately 100 millimeters/second without decreasing the image quality, that is, without producing any unevenness in the colored density. For feed speeds equal to or less than 15 millimeters/second the image formed on receiving medium 140 always will be clear having an acceptable color density.

Receiving Medium Cassette 145

Referring once again to FIG. 1, receiving medium 140 is typically in the form of a stack sheets stored in receiving medium cassette 145 which are dispensed by pick up roller 150 and thereafter supplied to pressure developing device 300. Advantageously, cassette 145 can detect the sheet size of the stack of sheets stored therein. By identifying the sheet size of receiving medium 140, the document to be reproduced on receiving medium 140 can be scanned more quickly and thereby increases the speed at which the document is reproduced. Additionally by identifying the length of receiving medium 140, pressure developing device 300 need not detect the end/bottom of receiving medium 140 for determining when to energize motor 405 for moving intermediate pressure roller 355 away from top pressure roller 350.

Figure 34:
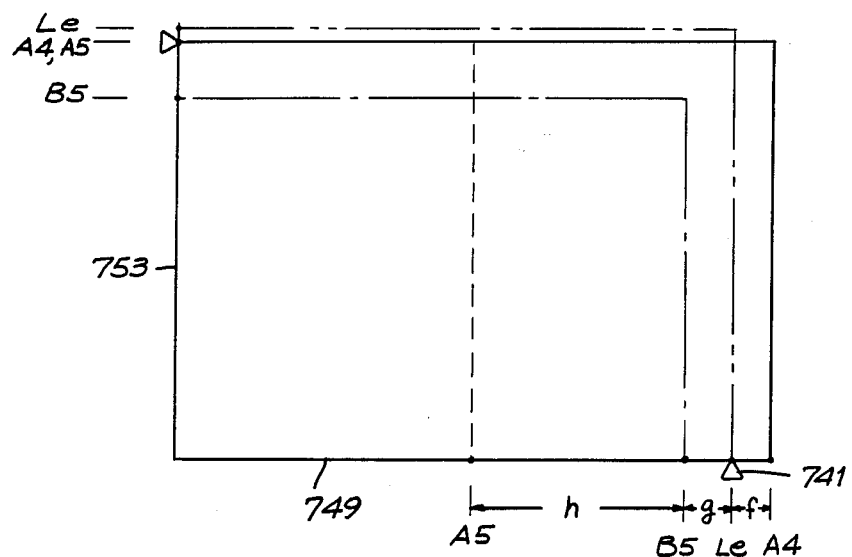
FIG. 34 is a plan view illustrating four different sheet sizes of receiving medium.

Sheet sizes typically used for receiving medium 140 include A4, A5, B5 and Le are shown in FIG. 34. Sheet size A4 is represented by the solid line. Sheet size A5 is represented by the dashed lines. Sheet size B5 is represented by the dot-dashed lines. Sheet size Le is represented by the double dot-dashed lines.

A pair of detectors 741 and 745 are disposed in a fixed position relative to sides 749 and 753 of sheets, A4, A5, B5 and Le. Detector 741 is activated by side 749 of each sheet Le and A4 pressing thereagainst. Detector 745 is activated by side 753 of each sheet of A4 and A5 pressing thereagainst. This relationship is more clearly set forth in Table 5 below:

TABLE 5

| Sheet Size | Sheet Measurement Width (mm) | Length (mm) | Detector Activated - 0 Not activated - x 745 | 741 | Note |
|---|---|---|---|---|---|
| A4 | 210 | 297 | o | o | |
| A5 | 148 | 210 | o | x | |
| B5 | 182 | 257 | x | x | |
| Le | 216 | 280 | x | o | letter size |

As shown above, the outputs of detectors 741 and 745 are different for each of these four sheet sizes.

Figure 35:
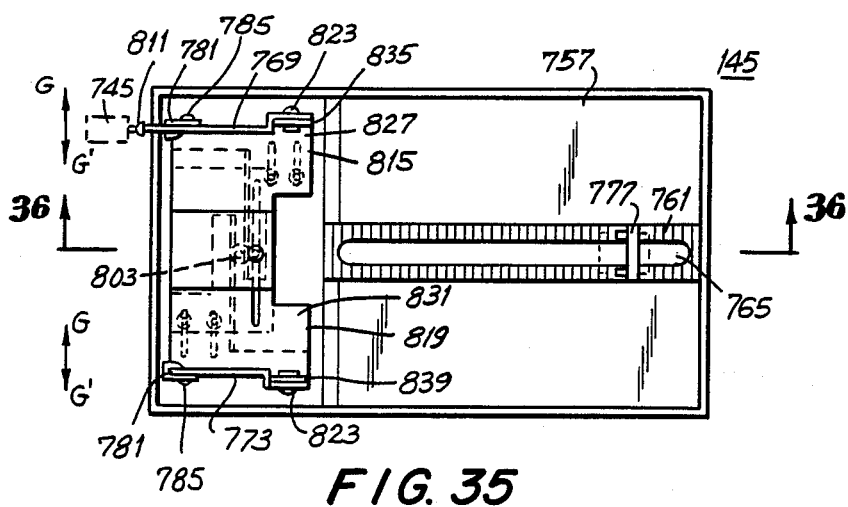
FIG. 35 is a top plan view of a receiving medium cassette for use in an apparatus of FIG. 1 in accordance with the invention.
Figure 36:
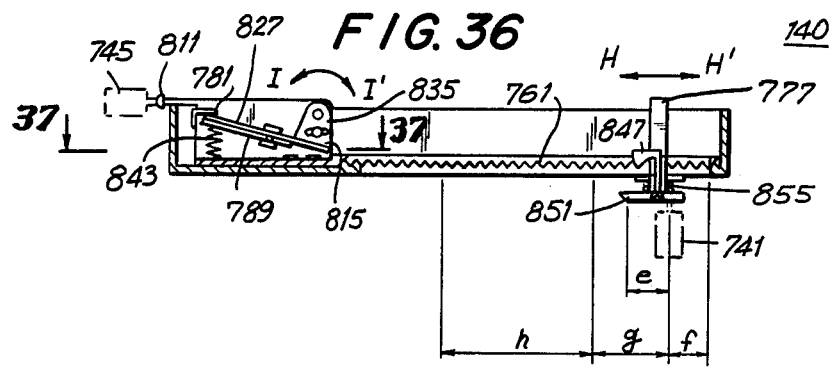
FIG. 36 is a cross-sectional view of the receiving medium cassette taken along line 36—36 of FIG. 35.
Figure 37:
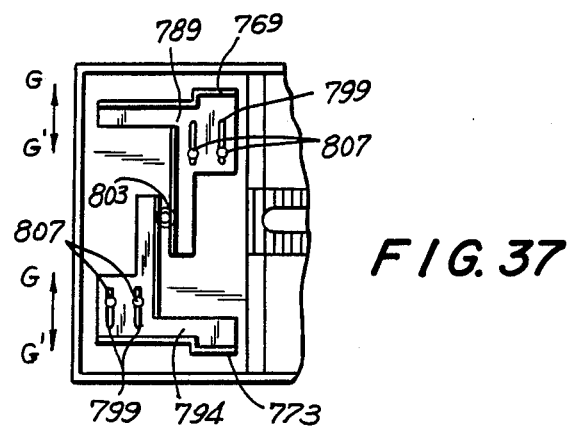
FIG. 37 is a cross-sectional view taken along line 37—37 of FIG. 36.

Cassette 145 is constructed in order to identify each of these four different sheet sizes based on the truth table of Table 5. As shown in FIGS. 35, 36, and 37, cassette 145 includes a body 757 having a rectangular shaped toothed portion 761 formed on the interior bottom surface thereof. Toothed portion 761 includes an oval shaped opening 765. A pair of positioning plates 769 and 773 are slidable in directions denoted by arrows G and G' and are adapted to centrally position a sheet or a stack of sheets in receiving medium 40 relative to the width of body 757. A plate 777 is operable for positioning a sheet or a stack of sheets for receiving medium 140 along the length of body 757. Plate 777 extends through opening 765 and protrudes both above tooth portioned 761 and below the bottom of body 757. Plate 777 slides in linear reciprocating directions denoted by arrows H and H'. A pawl 781 is secured to plates 769 and 773 by a pin 785.

Plates 769 and 773 are formed with racks 789 and 794 each of which has a pair of grooves 799. Racks 789 and 794 meshingly engage with a pin 803. Extending through each groove 799 and connected to body 757 is a pin 807 for restricting movement of plate 769 and 773 in directions denoted by arrows G and G'. Plates 769 and 773 ensure that all sheet sizes are properly placed within container 145 with the sheet centrally positioned relative to the width of cassette 145. The sheets will therefore be properly aligned with photosensitive medium 115 as each enters pressured developing device 300.

Plate 769 includes a contact point number 811 which protrudes outwardly from the top of body 757. Detector 745 is fixedly disposed relative to body 757 such that when sheet size A4 and A5 is inserted within body 757 and plate 769 is adjusted so as to rest along the edge of the sheet, contact point member 811 pressingly engages detector 745 to thereby actuate the latter.

An additional pair of plates 815 and 819 are rotatably connected to positioning plates 769 and 773 by pins 823, respectively. Plates 815 and 819 have substantially planar surfaces 827 and 831 which are substantially perpendicular to plates 769 and 773, respectively. Plates 815 and 819 also include a pair of arms 835 and 839 which extend substantially perpendicularly to planar surfaces 827 and 831 and are substantially parallel to plates 769 and 773, respectively. Pins 823 extend through openings within arms 835 and 839. Plates 815 and 819 upon which the sheet or sheets of receiving medium 140 rest are slideably movable in directions denoted by arrows G and G' through connection to plates 769 and 773, respectively, as well as pivotal in directions denoted by arrows I and I' about pins 823.

When placing a sheet or a stack of sheets of receiving medium 140 within cassette 145, the front edge of the top sheet is held down by pawls 781. Springs 843 which are connected to the bottom interior surface of body 757 and to pawls 781 biases pawls 781 in a downward direction to ensure that the top sheet of receiving medium 140 is always urged in a downwardly direction toward the bottom interior surface of body 757.

Plate 777 includes a tongue 847 which meshingly engages toothed portion 761, a contact point member 851 which is connected to the distal end of plate 777 and a spring 855 which rests upon contact point member 851 and presses upwardly against the exterior bottom surface of body 757. Accordingly, tongue 847 is lockingly engaged between the teeth of toothed portion 761 due to the bias of spring 855. Tongue 847 can be unlocked by pushing plate 777 upwardly so as to disengage tongue 847 from between the teeth of toothed portion 761.

Detector 741 is fixedly positioned relative to the bottom exterior surface of body 757. The length of contact point number 851 and the position of detector 741 are such that the following relationship between distances e, f, g and h as shown in FIGS. 34 and 36 exist;

$$f<e<g<h$$

Accordingly, for sheet sizes Le and A4, contact point member 851 will pressingly engage against detector 741. For sheet sizes A5 and B5, however, contact point member 851 is not in contact with detector 741.

Detectors 741 and 745 are preferably microswitches rendered conductive by being pressingly engaged. A control circuit (not shown) monitors detectors 741 and 745 and based on whether detectors 741 and 745 are in their conductive or nonconductive states determines which sheet size is disposed within container 145. By identifying the sheet size of receiving medium 140 the control circuit will regulate the feed speed of receiving medium 140 and the exposure time for photosensitive medium 115. Accordingly, photosensitive medium 115 is not unnecessarily exposed to light and the image is not incompletely formed due to insufficient exposure time as compared to prior art image forming apparatuses.

Thermal Treatment Mechanism 400

Following the development of the image on receiving medium 140 by pressure developing device 300, receiving medium 140 is fed through a thermal treatment mechanism 400 for fixing the image on receiving medium 140 by application of heat thereto. Heating of the image promotes further development reaction and serves to dissolve both the developer provided on receiving medium 140 and the mixture of optically hardening matter and dye precursors on receiving medium 140. Following thermal treatment by mechanism 400, the image formed surface of receiving medium 140 has a glossy finish providing an attractive finished product with a film coating thereon which will deteriorate very slowly, if at all, over time.

Figure 38:
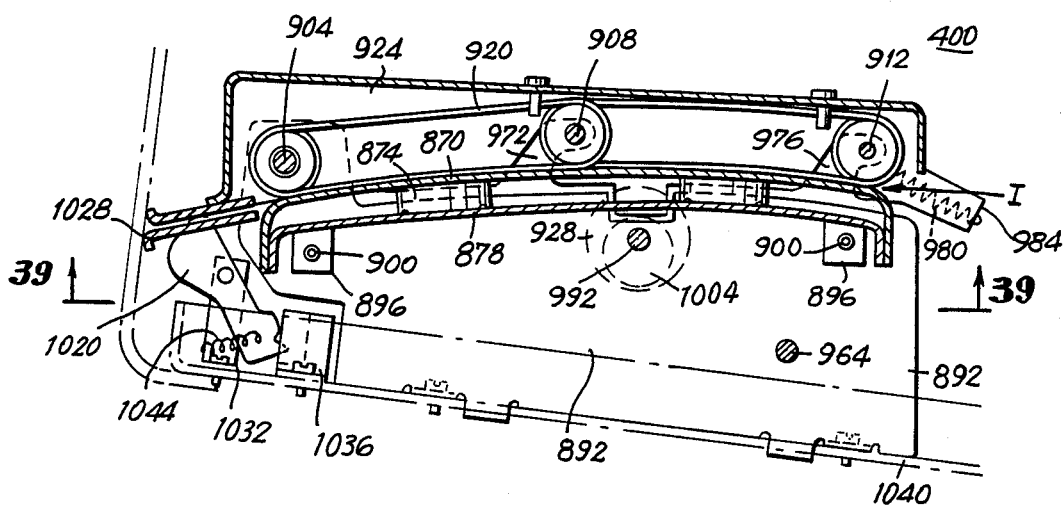
FIG. 38 is a front elevation view of a thermal treatment mechanism for use in an apparatus of FIG. 1 in accordance with the invention.
Figure 39:
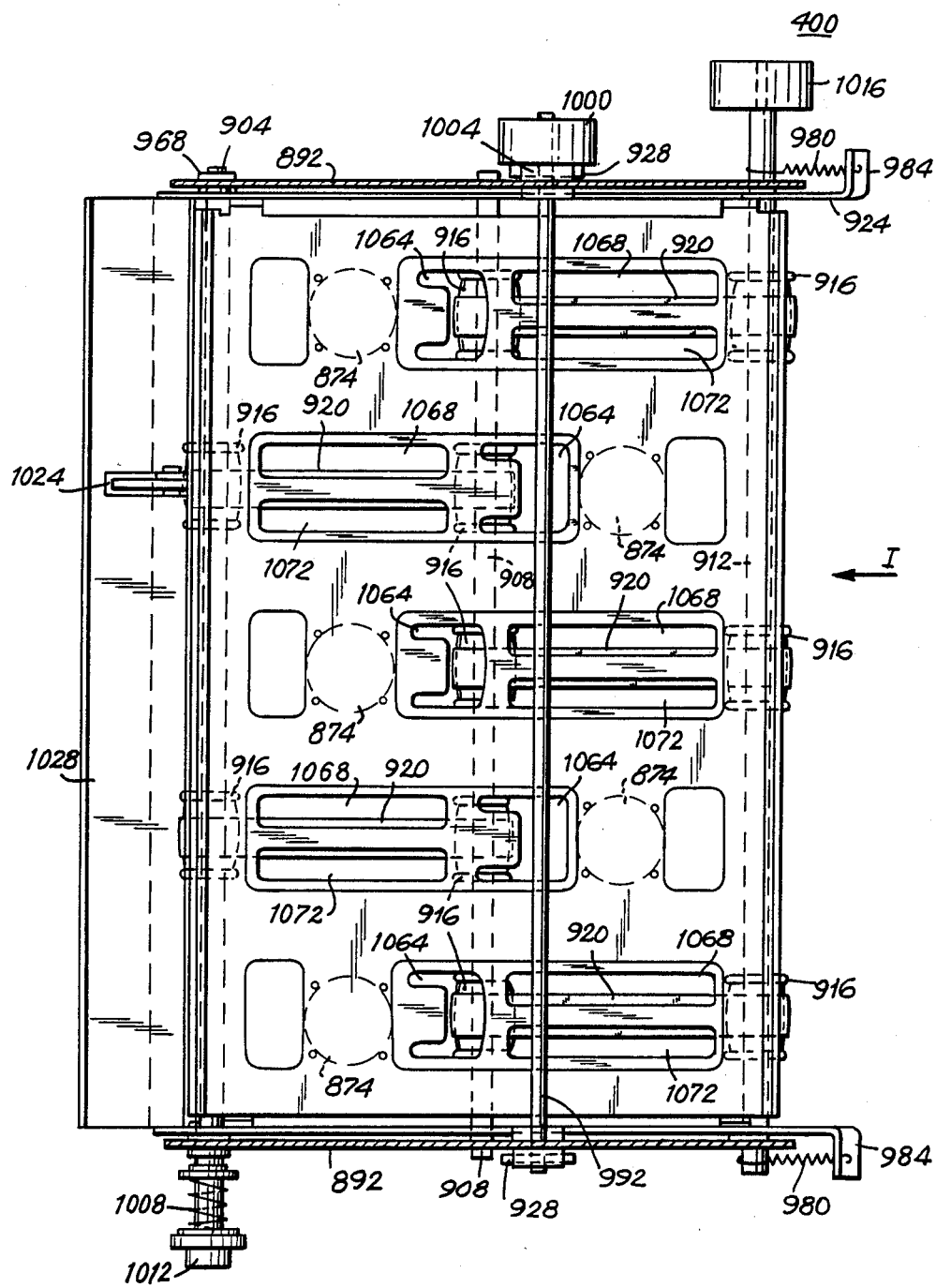
FIG. 39 is a bottom plan view of the thermal treatment mechanism taken along line 39—39 of FIG. 38.

As shown in FIGS. 38–40, thermal treatment mechanism 400 includes a heat plate 870 having a heater 874. Heater 874 is secured between heat plate 870 and another heat plate 878. Heat plate 878 which supports heaters 874 and 870 is secured to diametrically opposing side plates 892 by four feet 896 which are located under heat plate 878 and which are secured to side plates 892 by screws 900. Three belt shaft 904, 908 and 912 support a plurality of rollers 916 around which are wrapped five belts 920 for carrying receiving medium 140 through mechanism 400. Belt shafts 904, 908 and 912 are rotatably supported by an uppercase 920 of mechanism 400. Belts 920, which are stretched between rollers 916, are made from silicon resin and the like having a suitable heat resistance. By being stretched between a pair of rollers 916, each belt 920 is prevented from slipping off rollers 916; thereby ensuring a rotatably stable support for receiving medium 140 to travel on. The projecting portion of each belt 920 is centrally positioned on each roller 916 over which it is stretched. Uppercase 924 is opened or closed by disc cams 928.

Figure 42:
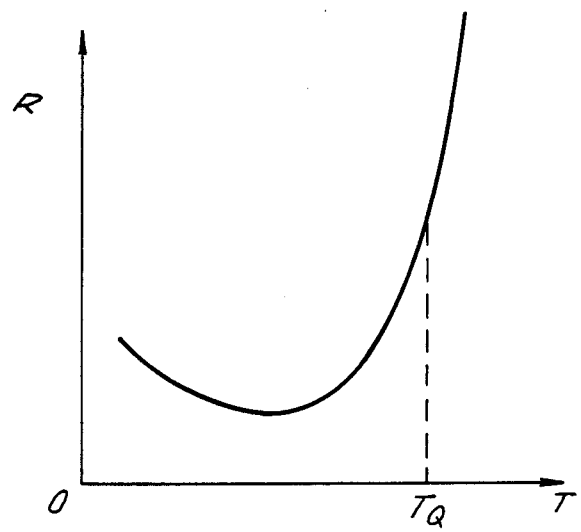
FIG. 42 is a graph plotting the temperature-resistance characteristic of the heater.
Figure 43A:
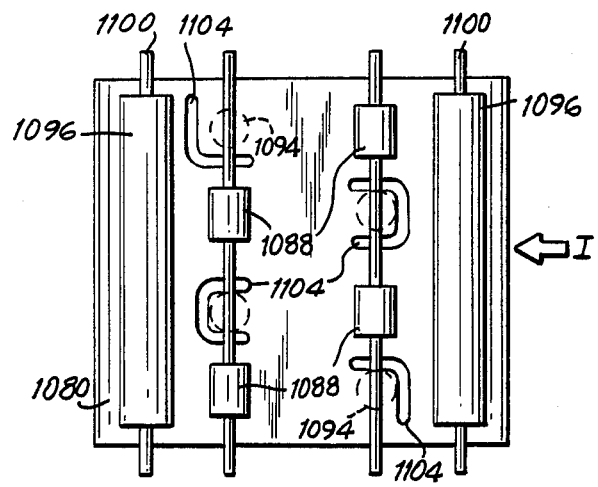
FIG. 43a is a top plan view of a thermal treatment mechanism in accordance with an alternative embodiment of the invention.
Figure 43B:
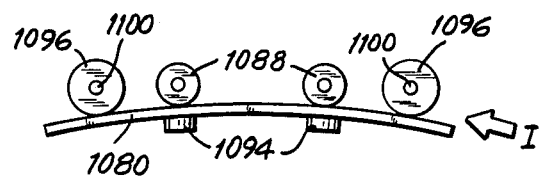
Figure 44B:
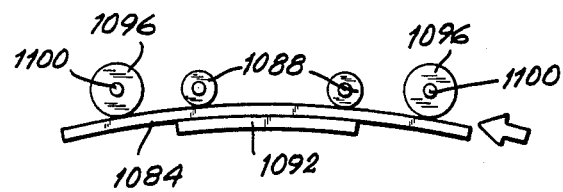
Figure 44A:
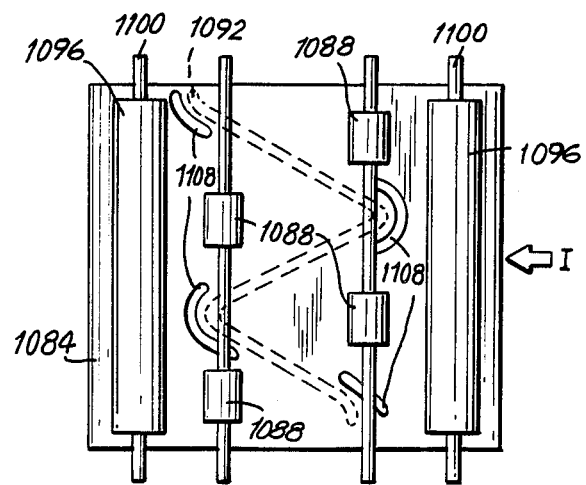
FIG. 44a is a top plan view of a thermal treatment mechanism in accordance with another embodiment of the invention.

As shown in FIG. 42, each heater 874 includes electrodes 932 and 936 on heat transfer sheets 940 and 944 which are sandwiched together and supported by a concave portion 948 of a heat resistent heater case 952. A heating element 956 is sandwiched between and connected to electrodes 932 and 936. Heater case 952 is fixedly positioned between heat plates 870 and 878 by a belleville spring 960 which is disposed between the bottom exterior surface of heater case 952 and heat plate 878. Spring 960 which rests on heat plate 878 biases heater case 952 towards heat plate 870; thereby pressing heat transfer sheet 940 against the interior surface of heat plate 870.

A positive thermal coefficient thermistor is used as heating element 956. As is well known, an increase in the temperature of a thermistor causes a sharp rise in its resistance which is graphically depicted in FIG. 42. Accordingly, the positive thermal coefficient thermistor can provide the desired temperature $T_Q$ without having to resort to other temperature adjusting means. Preferably, a thermistor capable of reaching temperature $T_Q$ of between 150 to 180 degrees centigrade should be used.

Referring to FIGS. 38–40 once again, side plates 892 are fixedly secured and reinforced by a couplingly bar 964; thereby preventing side plates 892 from repositioning themselves relative to each other during operation of mechanism 400. On both side walls of uppercase 924 are bearings 968 connected thereto and which rotably support shaft 904. The circumference of bearings 968 are guided by the perimeters of openings in side plates 892. Uppercase 924 is pivotably mounted on side plates 892. Both side walls of uppercase 924 include grooves 972 and 976 regulating the vertical positions of belt shafts 908 and 912, respectively. Each roller 916 includes a central projection and is made from a heat resistant synthetic resin or metal with a non-slip exterior surface.

A tension spring 980 is stretched between and connected to a distal end portion 984, which protrudes from a side of uppercase 924, and belt shaft 912; thereby providing a tensile force to belts 920. Distal end portion 984 is positioned below groove 976 and supplies shafts 908 and 912 with a component of force directed downwardly. Grooves 972 and 976 have widths designed to remain out of contact with belt shafts 908 and 912 even when any of the five belts 920 are in close proximity to heat plate 870. During operation of mechanism 400, uppercase 924 is closed so that belts 920 are in contact with receiving medium 140 and supply sufficient pressure to carry receiving medium 140 in close proximity to heat plates 870. With uppercase 924 opened, a space is provided between belts 920 and heat plate 870.

For opening uppercase 924, mechanism 400 includes cam shaft 992 which is rotatably supported by both side plates 892. Disc cams 928 are attached to respective outer surfaces of side plates 892. A knob 1000 for manually rotating cam shaft 992 is connected to the outside face of one of the pair of disc cams 928. The bottom surface of a protruding portion 1004 of uppercase 924 abuts disc cam 928. By rotating knob 1000, disc cam 928 pushes protruding portion 1000 upwardly which opens uppercase 924. Uppercase 924 can be further opened by lifting along its rim which is formed with grooves 972 and 976.

One end of belt shaft 904 is mounted to a spring clutch 1008 which includes a gear 1012 which is meshed with an external power mechanism for rotating gear 1012 which in turn rotates belt shaft 904 and thus belts 920. The speed at which gear 1012 rotates is slightly higher than the feed speed of receiving medium 140 as the latter passes through pressure developing device 300. The frictional torque of spring clutch 1008 provides an adequate tensile force for carrying receiving medium 140. A knob 1016 is coupled to the external power source through spring clutch 1008 and is also coupled to belt shaft 912. In the event that mechanism 400 malfunctions, knob 1016 can be rotated to move those belts 920 coupled to belt shaft 912 through rollers 916 to carry and thereby remove any portion of receiving medium 140 which is caught within mechanism 400.

Thermal treatment mechanism 400 also includes a detecting device for monitoring the passage of receiving medium 140 therethrough. This detecting device includes a movable strip 1020 having ends 1021 and 1022. End 1021 is positioned in a groove 1024 of a lower guide plate 1028 provided at the outlet of mechanism 400. End 1022 of movable strip 1020 is disposed in a photocoupler 1036. Movable strip 1020 is rotatably supported by a support member 1032 which is secured to a bottom plate 1040 of mechanism 400. Photocoupler 1036 includes an emission element such as a light emitting diode and an optic element such as a photodiode which are disposed diametrically opposite one another with a gap therebetween. When end 1022 of movable strip 1020 is moved into the gap; the reception of light by the optic element from the emission element is interrupted. Mechanism 400 also includes an upper guide plate 1048 at its outlet. Movable strip 1020 is biased upwardly toward upper guide plate 1048 by a weak tension spring 1044 In the absence of receiving medium 140 between lower guide plate 1028 and upper guide plate 1048, spring 1044 biases end 1021 of movable strip 1020 towards contact with upper guide plate 1048. With end 1021 in contact with upper guide plate 1048, end 1022 does not enter the gap of photocoupler 1036 and therefor does not interrupt the path of light between the emission element and optic element thereof. As receiving medium 140 travels through the outlet of mechanism 400, however, end 1021 is rotated in counterclockwise direction resulting in end 1022 entering the gap and interrupting reception of light by the optic element from the emission element of photocoupler 1036. Control circuitry (not shown) monitors whether light has been interrupted within photocoupler 1036 and can thereby determine whether receiving medium 140 has passed through mechanism 400.

Other suitable methods for detecting the passage of receiving medium 140 also can be employed. For example, a photocoupler can direct light towards the outlet of mechanism 400. Based on the difference in the amount of light reflected when receiving mmedium 140 is present or absent from the outlet of mechanism 400, the passage of receiving medium 140 can be determined. Alternatively, the amount of light transmitted/flowing across the outlet is monitored and will vary depending upon the presence or absence of receiving medium 140 as it travels therethrough. The difference in the amount of transmissive light is used to detect the passage of receiving medium 140. In yet another alternative embodiment, a microswitch can be positioned so as to come into contact with the receiving medium 140 as it passes through the outlet of mechanism 400 to determine the passage of receiving medium 140 through the outlet.

Receiving medium 140 as it is fed out from pressure developer 300 is fed by a side plate 1060 (shown in FIG. 1) and is then inserted between heat plate 870 and 878 in a direction denoted by arrow I in FIG. 38. Since belts 920 move at a slightly higher speed than the feed speed of receiving medium 140 as the latter leaves pressure developing device 300, receiving medium 140 is drawn into thermal treatment mechanism 400 without any slack being created therein. As shown in FIG. 39, receiving medium 140 is carried into thermal treatment mechanism 400 by three of the five belts 920 and is carried out of thermal treatment mechanism 400 by two of the five belts 920. Heat plate 870 is designed to gradually curve downwardly so that receiving medium 140 can be carried through thermal treatment mechanism 400 with its rear surface attached to heat plate 870. Due to the positioning of belts 920, thermal treatment mechanism 400 can transport even a small cut sheet therethrough.

An opening 1064 is provided between each heater 870 and one of the five belts 920. Additional openings 1068 and 1072 are also provided to vent heat generated by heater 874. Such ventilation is necessary to prevent color formers disposed on the surface of receiving medium 140 from melting onto belts 920.

By maintaining heater 874 at a temperature range between 150 to 180 degrees centigrade, the surface temperature of heat plate 870 is maintained at approximately 130 degrees centigrade. Temperatures at about 130 degrees centigrade ensure that the quality of the image on receiving medium 140 will not be damaged even if receiving medium 140 is exposed for prolonged periods of time to temperatures of about 130 degrees centigrade. Color formers, dye precursors and the like used in the formation of the image on receiving medium 140 are melted substantially and decrease in viscosity at approximately 100 degrees centigrade.

When heated at 130 degrees centigrade for approximately 5 seconds, a very good glossy image is developed on receiving medium 140. For temperatures ranging between 100 and 130 degrees centigrade an image on receiving medium 140 having a substantially good glossy finish will be obtained. The upper temperature limit of heat plate 870 is based on the temperature at which the substrate of receiving medium 140 changes in quality and is about 200 degrees centigrade. The heating time (5 seconds or more) as used herein means the period during which receiving medium 140 is heated at the defined temperature. Of course, the total time during which receiving medium 140 travels through thermal treatment mechanism 400 is greater than the actual heating time of 5 seconds. Heating medium 140 as it travels through thermal treatment mechanism 400 is sandwiched between belts 920 and heat plate 870 and is exposed at some point in its journey therethrough to temperatures lower than the melting point of the color formers and the like. Due to heat plate 870 uniformly contacting the surface of receiving medium 140 on which the image is formed, promotion of the color forming reaction of the image is created and also causes the melting of color formers and the like.

FIGS. 43a, 43b, 44a and 44b illustrate thermal treatment mechanisms in accordance with alternative embodiments of the invention. In both of these alternative embodiments receiving medium 140 is transported by a plurality of rollers 1088 rather than be belts 920. Heaters 1094 and 1092 are disposed below heat plates 1080 and 1084, respectively. Heater 1092 has band-like zigzag shape which avoids overlapping/crossing rollers 1088. Perferably, a nickel-chromium wire coated with a heat resistant resin is used as heater 1092. Heaters 1094 are in the shape of discs. Heaters 1092 and 1094 are similar to heaters 874 described above.

An additional pair of rollers 1096 are attached to drive shafts 1100 and have surfaces formed of pimples and dimples to increase the frictional coefficient for transporting receiving medium 140. The surfaces of rollers 1096 are made from silicon rubber or the like having suitable heat resistences. Rollers 1088 which are disposed between rollers 1096 serve to guide receiving medium 140 into close proximity and contact with heat plates 1080 and 1084. Rollers 1088 also aid in feeding the top and bottom ends of receiving medium 140 through the thermal treatment mechanism.

Heat plates 1080 and 1084 include slits 1104 and 1108 near heaters 1094 and 1092, respectively. Slits 1104 and 1108 serve as vents to decrease the temperature in this part of the thermal treatment mechanisms and thereby prevent the color formers and the like disposed on the surface of receiving medium 140 from being softened or melted and pressed by rollers 1088 and 1096. The heating mechanisms of FIGS. 43a and 43b, and 44a and 44b represent significant simplifications compared thermal treatment mechanism 400. Heater 1092 provides a uniform temperature distribution in the heated area of heat plate 1084 so that an image having a uniform glossy finish is readily formed on receiving medium 140.

Heating treatment mechanism 400 and the alternative embodiments described in FIGS. 43a and 43b and 44a and 44b ensure that at least the image formed area on receiving medium 140 is heated to a temperature higher than the softening point of the materials used for forming the image. Consequently, thermal treatment mechanism 400 and the alternative embodiments thereto provide that:

(a) Receiving medium 140 is heated to a predetermined temperature irrespective of the surrounding ambient temperature. Consequently, the development reaction speed is increased resulting in a good quality image produced in a relatively short time interval. In particular, a high quality color balance is obtained in the color image formed on receiving medium 140.

(b) The dye precursors and other materials on receiving medium 140 used for forming an image thereon are heated to a temperature higher than the softening point causing the same to melt and to create a smooth surface. The materials are then solidified so that receiving medium 140 has a glossy finish and a clear appearance.

(c) A minimum area of the image is in contact with air so that the materials for forming the image are minimally affected by exposure to oxygen or a variety of other harmful gases existing in the air. The image formed on receiving medium 140 also will be preserved for a long period of time.

(d) The image is not contacted by the drive means of thermal treatment mechanism 400; thereby ensuring that the image is not adversely affected by such drive means.

Driving Mechanism

Referring once again to FIG. 1, photosensitive medium 115, receiving medium 140 and script table 125 is controlled by motor 440. Takeup shaft 620 is engaged with a storage shaft 1200 (shown in FIG. 45) of cassette 110 for storing photosensitive medium 115. Rewinding shaft 610 is engaged with a supply shaft 1205 (also shown in FIG. 45) of cassette 110. The rotational power of motor 440 is transmitted to takeup shaft 620 and to rewinding shaft 610 through a spring clutch and a gear train, respectively. Top pressure roller 350 is rotated by photosensitive medium 115 pressing thereagainst as the latter travels between supply shaft 130 and storage shaft 155. Upon energization of a solenoid, the power of motor 440 is transmitted to pickup roller 150 through operation of a solenoid clutch and a ratchet wheel. The top sheet of receiving medium 140 contained in cassette 145 is led by pickup roller 650 through one revolution of the latter and delivered to top pressure roller 350. Receiving medium 140 which is led into thermal treatment mechanism 400 travels at a feed speed which is slightly slower than speed at which receiving medium 140 enters thermal treatment mechanism 400. The speed at which receiving medium 140 enters thermal treatment mechanism 400 is powered by motor 440.

During the exposure period in which photosensitive medium 115 is exposed to light representing the image, contact roller 630 is pressed against top pressure roller 350 so that tension is supplied to photosensitive medium 115 by a spring clutch of rewinding shaft 610. Photosensitive medium 115 is then transported at the same speed as script table 125. Receiving medium 140 is at the same time being transported by pickup roller 150 motor (powered by motor 405) toward developing device 300. Photosensitive medium 115 and receiving medium 140 are pressed against each other in pressure developing device 300 such that the latent image is transferred from photosensitive medium 115 and developed on receiving medium 140. After pressure development, photosensitive medium 115 and receiving medium 140 are separated from each other with photosensitive medium 115 being taken up by storage shaft 1200 by the power of motor 440. Shortly after detection of the end of receiving medium 140, intermediate pressure roller 355 separates from top pressure roller 350 resulting in photosensitive medium 115 no longer being pressed against receiving medium 140. Receiving medium 140, which is then separated from photosensitive medium 115, enters thermal treatment mechanism 400 through guide 1060. Thermal treatment mechanism 400 promotes the color forming reaction on medium 140 creating a glossy finished image thereon. Receiving medium 140 is thereafter fed out of thermal treatment mechanism 400 and stored in container 160.

At the time that the load is removed from photosensitive medium 115 due to the separation of intermediate pressure roller 355 from top pressure roller 350, the bottom end of the latent image formed on photosensitive medium 115 is positioned between top pressure roller 350 and intermediate pressure roller 355. Shortly thereafter, receiving medium 140 is completely separated from photosensitive medium 115, and contact roller 630 is then moved away from top pressure roller 350. At the same time, rewinding shaft 610 is rotated in a counterclockwise direction whereby the bottom end of the latent image formed on photosensitive medium 115 is rewound until reaching exposure table 135.

The rewinding time of photosensitive medium 115 is calculated by a control system (not shown) based on the distance between the bottom end of the latent image formed on photosensitive medium 115 and exposure table 135 and on the transport speed of photosensitive medium 115. Rewinding of photosensitive medium 115 is caused by reverse rotation of supply shaft 1205. The transport system of photosensitive medium 115 also ensures and promotes the full utilization of photosensitive medium 115.

Apparatus 100 uses only motor 440 for transporting photosensitive medium 115 and receiving medium 140 therethrough resulting in a simplified transport structure which minimizes potential problems arising therefrom.

Figure 46:
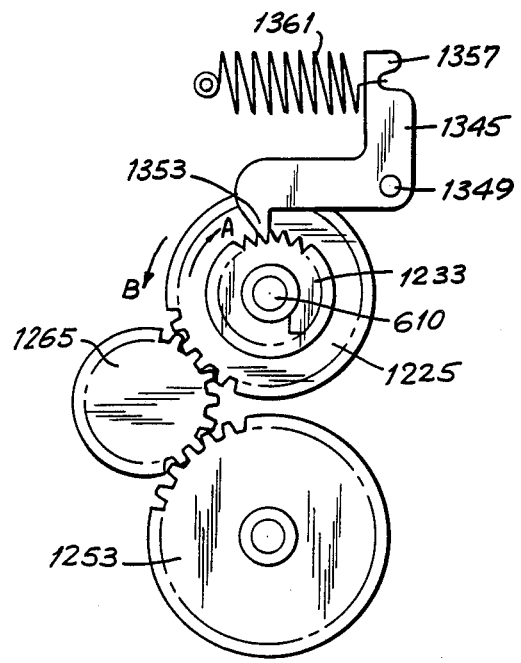
FIG. 46 is a cross-sectional view of the driving mechanism taken along line 46—46 of FIG. 45.

Referring now to FIG. 46, a mechanism 1300 for rotating rewinding shaft 610 and takeup shaft 620 is shown. Mechanism 1300 includes supply shaft 1205 around which the unexposed portion of photosensitive medium 115 is wound. A boss 1209 is attached to one end of supply shaft 1205. Storage shaft 1200, which takes up the exposed portion of photosensitive medium 115, has attached to one end thereof a boss 1213. Rewinding shaft 610, takeup shaft 620, a driving shaft 1217 and a ratchet shaft 1221 are rotatably fitted into mechanism 1300 through bearings (not shown). A gear 1225, a coil spring clutch 1229 and a ratchet 1233 are mounted on rewinding shaft 610. A gear 1237 and a coil spring clutch 1241 are mounted on takeup shaft 620. A gear 1245, an engaging plate 1249 and a gear 1253 are rotatably mounted on driving shaft 1217. A meshing clutch 1257 is slidably mounted on driving shaft 1217 along the major axis of the latter. A driving gear 1261 is also mounted on driving shaft 1217. A planet gear 1265 engagingly meshes with and between gear 1225 and gear 1253 such that rewinding shaft 610 is rotatingly coupled to and rotates in the same direction as driving shaft 1217.

A pair of bosses 1269 and 1273 of coil spring clutches 1229 and 1241 are engagingly mounted on rewinding shaft 610 and takeup shaft 620, respectively. An additional pair of bosses 1277 and 1281 of coil spring clutches 1229 and 1241 are formed with projections fitting into openings 1285 and 1289 of bosses 1209 and 1213, respectively. Bosses 1277 and 1281 are biased towards openings 1285 and 1289 by a pair of coil springs 1293 and 1297 of coil spring clutches 1229 and 1241, respectively. Inasmuch as the wire diameter of coil spring 1293 is greater than the wire diameter of coil spring 1297, the rotational torque (T1) of supply shaft 1205 is greater than the rotational torque (T2) of storage shaft 1200.

Figure 45:
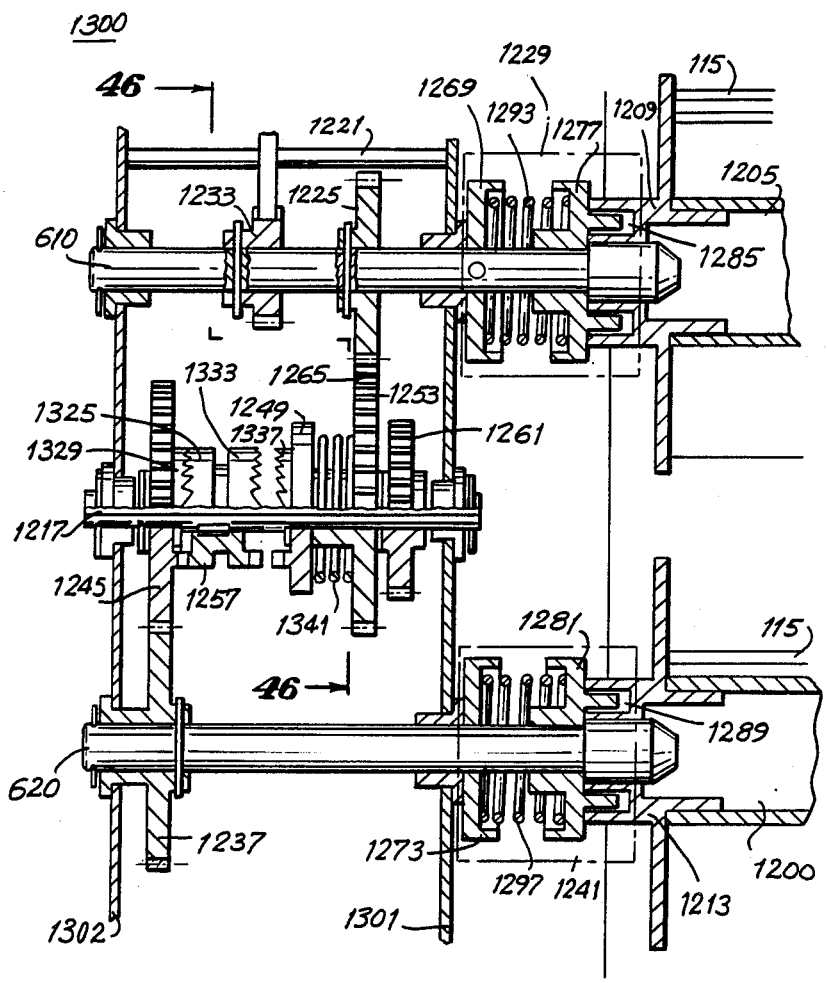
FIG. 45 is a cross-sectional view of a driving mechanism for a supply shaft and storage shaft for use in an apparatus in accordance with one embodiment of the invention.
Figure 47:
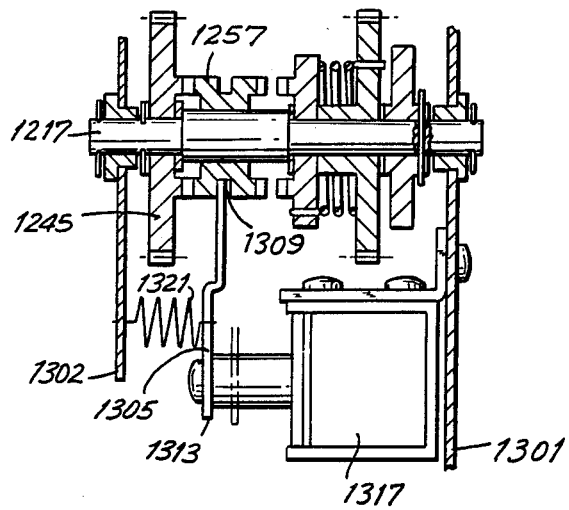
FIG. 47 is a bottom plan view of the driving mechanism of FIG. 45.

As shown in FIG. 47, an engaging plate 1305 has an end 1309 engaging with meshing clutch 1257. The other end 1313 of engaging plate 1305 is connected to a solenoid 1317 which is secured to a wall 1301 of mechanism 1300. A spring 1321 is connected between engaging plate 1305 and another wall 1302 of mechanism 1300. Consequently, as shown in FIG. 45 a meshing part 1325 of meshing clutch 1257 will be in mesh with a meshing portion 1329 of gear 1245. Since gear 1237 meshes with gear 1245 and is mounted on takeup shaft 620, rotation of gear 1245 will cause rotation of takeup shaft 620.

Actuation of solenoid 1317 causes meshing clutch 1257 to move toward the right as viewed in FIG. 47 due to engaging plate 1305 being connected therebetween. Consequently, a meshing part 1333 of meshing clutch 1257 meshes with a meshing part 1337 of meshing plate 1249. Rotation of driving shaft 1217 now will cause rewinding shaft 610 rather than takeup shaft 620 to rotate with both driving shaft 1217 and rewinding shaft 610 rotating in the same direction. A spring 1341 is connected between meshing plate 1249 and gear 1253 so as to bias the former to the latter.

As shown in FIG. 46, a ratchet pawl 1345 is rotatably mounted on ratchet shaft 1349 and has a distal end 1353. A first end 1353 is operable for meshing with the teeth of ratchet 1233. A second end 1357 of pawl 1345 is connected to a spring 1361. Pawl 1345 is biased by spring 1361 so that end 1353 meshes with ratchet 1233 to permit rewinding shaft 610 to rotate only in a clockwise direction. Sufficient tension of photosensitive medium 115 therefore is always maintained.

Other suitable types of clutches besides meshing clutches and coil spring clutches as described above can be used in mechanism 1300 and include, but are not limited to, friction clutches, cone clutches, centrifugal clutches and electromagnetic clutches.

Referring once again to FIG. 1, contact roller 630 is in rotatable contact with a shaft 1365. An arm 1369 is coupled to shaft 1365 and is in rotatably contact with contact roller 630. Arm 1369 is connected to a spring 1373 and rotates about shaft 1365 in a direction denoted by arrow 0 so as to urge contact roller 630 to press against photosensitive medium 115. Contact roller 630, which rotates in a direction G, in combination with top pressure roller 350 guides photosensitive medium 115 as it is rewound around storage shaft 155. A slide portion (not shown) of solenoid 1317 is also connected to arm 1369. During operation of solinoid 1317, arm 1369 rotates about shaft 1365 in a direction denoted by arrown N. Consequently, contact roller 630 moves away from and out of contact with top pressure roller 350 so as to not interfere with the rewinding of photosensitivem medium 115.

The relationship between rotational torques of supply shaft 1205, storage shaft 1200, contact roller 630 and intermediate pressure roller 355 are represented by T1, T2, T3 and T as follows:

| | |
|---|---|
| T1 > T2 | (eq. 1) |
| T1 > T2 + T3 | (eq. 2) |
| T1 > T2 + T4 | (eq. 3) |

Eq. 1 is obtained by providing that the spring pressure of coil spring 1293 disposed within coil spring clutch 1229, which is mounted on rewinding shaft 610, is greater than the spring pressure of coil spring 1297 disposed within coil spring clutch 1241 which is mounted on takeup shaft 620. The relationship expressed in eq. 2 is established through the spring pressure of spring 1373 pressing against contact roller 630. The relationship expressed in eq. 3 is established by the spring pressure of application spring 485 transmitted to intermediate pressure roller 355.

Photosensitive medium 115 is transported within apparatus 100 based on the relationships of eq. 1, eq. 2 and eq. 3 as follows: When an unexposed portion of photosensitive medium 115 is to be used (i.e., exposed), takeup shaft 620 is rotated in the direction of arrow C while contact roller 630 is rotated in the direction of arrow O to press photosensitive medium 115 against top pressure roller 350. Contact roller 630 rotates in the direction of arrow G whereby the rotational torque of T2+T3 is generated. Supply shaft 1205 rotates in the direction of arrow A. Ratchet 1233 and ratchet pawl 1345 operate as a braking force against rotation in the direction of arrow B. Rotational torque T1 is transmitted to supply shaft 1205 by coil spring clutch 1229 pressing against boss 1209 of supply shaft 1205. Photosensitive medium 115 is drawn from cassette 110 and transported through pressure developing device 300 by the rotational torque of T2+T3−T1. Upon passing contact roller 630, photosensitive medium 115 is wound around supply shaft 155 based on the rotational tongue T2.

With photosensitive medium 115 and receiving medium 140 first sandwiched between top pressure roller 350 and intermediate pressure roller 355, intermediate pressure roller 355 moves in a direction denoted by arrow M to thereby press photosensitive medium 115 and receiving medium 140 against top pressure roller 350. Top pressure roller 350 and intermediate pressure roller 355 rotate in directions denoted by arrows E and F. Simultaneously contact roller 630 rotates in the direction denoted by arrow N so that the used photosensitive medium 115 is not pressed against top pressure roller 350 by contact roller 630. Photosensitive medium 115 is fed from cassette 110 to between top pressure roller 350 and intermediate pressure roller 355 by the rotational torque T2+T4−T1 and then taken up by the rotational tongue T2.

Immediately before the bottom end of receiving medium 140 is fed out from between top pressure 350 and intermediate pressure roller 355, intermediate pressure roller 355 begins moving in a direction denoted by an arrow L for removing pressure to receiving medium 140 and photosensitive medium 115. After the bottom end of receiving medium 140 is fed out from between top pressure roller 350 and intermediate pressure roller 355, rotation of top pressure roller 350 and intermediate pressure roller 355 is halted. A solenoid valve of solenoid 1317 is actuated moving meshing clutch 1257 to the right as viewed in FIG. 45. Supply shaft 1205 is then rotated in the direction of arrow B generating torque T1 so that the unexposed portion of photosensitive medium 115 designated by length S (shown in FIG. 1) is rewound. During this rewinding operation, storage shaft 1200 remains stationary. Torque T2, which operates as a braking force, is applied to storage shaft 1200 and must therefore be overcomed in order to rewind supply shaft 1205. Accordingly, photosensitive medium 115 is rewound around supply shaft 1205 by generating a rotational torque of T2−T1.

The relationships expressed by eq. 1, eq. 2 and eq. 3, require no special guide rollers for transporting photosensitive medium 115. Therefore the cost of manufacturing and size of apparatus 100 can be reduced.

It will this be seen that the objects set forth above, and those made apparent from the preceding description, are efficiently attained and, since certain changes may be made in the above method and constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. An image forming apparatus using pressure receiving materials, said pressure receiving materials including a receiving medium and a photosensitive medium having microcapsules on a front surface thereof, each microcapsule containing at least an optically hardening or softening matter and a color former; the photosensitive medium being first superposed on the receiving medium after exposing the photosensitive medium to light representative of the image to be formed, and being then pressed against the receiving medium for development of the image on the receiving medium, the apparatus comprising:

a photosensitive medium container for storing said photosensitive medium having an open-ended top;

exposing means for exposing said photosensitive medium to light representative of the image;

a receiving medium container for storing said receiving medium;

pressure developer means for applying pressure to said pressure receiving materials for development of the image on the receiving medium; and an external drive shaft; and wherein said photosensitive medium container includes a supply shaft around which the unexposed portion of said photosensitive medium is wound and which communicates with the external drive shaft; a member for rotatably supporting said supply shaft and for preventing exposure to light of the unexposed portion of the photosensitive medium; and a storage shaft around which the exposed portion of said photosensitive medium is wound and which communicates with the external drive shaft, said container serving as a replaceable cassette for rotatably supporting said storage shaft and wherein said member and said storage shaft are insertably received by said container through said open-ended top.

2. The image forming apparatus as claimed in claim 1, further including thermal treatment means for thermally treating only the receiving medium following development by the pressure developer means wherein said thermal treatment means includes means for heating at least the areas encompassing the developed image of said receiving medium to a temperature higher than the softening point of the matter forming the image.

3. The image forming apparatus as claimed in claim 1, further including a mechanism having a plurality of clutches operable for rotating both a supply shaft around which the unexposed portion of said photosensitive medium is wound and a storage shaft around which the exposed portion of said photosensitive medium is wound; said pressure developer means including a pressure roller operable for moving into or out of contact with the pressure receiving materials for applying pressure thereto; and a pressing contact roller operable for moving into or out of contact with said photosensitive medium for transporting the same; wherein said mechanism includes means operable for unwinding and rewinding about said supply shaft only that portion of said photosensitive medium which has not passed by said exposing means in a first direction and for preventing that portion of said photosensitive medium which has passed by said exposing means from traveling past said exposing means in a direction opposite to said first direction during rewinding.

4. The image forming apparatus as claimed in claim 1, wherein said pressure developer means includes a pair of pressure rollers operable for contacting the pressure receiving materials; and for advancing said pressure receiving materials at speeds of up to and including 100 mm/sec. under pressure.

5. The image forming apparatus as claimed in claim 1, wherein said pressure developer means includes a pair of pressure rollers and operable for contacting the pressure receiving materials; and at least one additional roller in contact with at least one of said pair of pressure rollers and having a diameter which is greater than the diameter of said at least one of said pair of pressure rollers.

6. An image forming apparatus using pressure receiving materials, said pressure receiving materials including a receiving medium and a photosensitive medium having microcapsules on a front surface thereof, each microcapsule containing at least an optically hardening or softening matter and a color former; the photosensitive medium being first superposed on the receiving medium after exposing the photosensitive medium to light representative of the image to be formed, and being then pressed against the receiving medium for development of the image on the receiving medium, the apparatus comprising;
 a photosensitive medium container for storing said photosensitive medium;
 exposing means for exposing said photosensitive medium to light representative of the image;
 a receiving medium container for storing said receiving medium;
 pressure developer means for applying pressure to said pressure receiving materials for development of the image on the receiving medium; and
 thermal treatment means for thermally treating only the receiving medium following development by the pressure developer means and including means for heating at least areas encompassing the developed image of said receiving medium to a temperature higher than the softening point of the matter forming the image and driving means for transporting said receiving medium through contact with areas exclusive of the portion which is softened on the receiving medium.

7. The image forming apparatus as claimed in claim 6, further including a mechanism having a plurality of clutches operable for rotating both a supply shaft around which the unexposed portion of said photosensitive medium is wound and a storage shaft around which the exposed portion of said photosensitive medium is wound; said pressure developer means including a pressure roller operable for moving into or out of contact with the pressure receiving materials for applying pressure thereto; and a pressing contact roller operable for moving into or out of contact with said photosensitive medium for transporting the same; wherein said mechanism includes means operable for unwinding and rewinding about said supply shaft only that portion of said photosensitive medium which has not passed by said exposing means in a first direction and for preventing that portion of said photosensitive medium which has passed by said exposing means from traveling past said exposing means in a direction opposite to said first direction during rewinding.

8. The image forming apparatus as claimed in claim 6, wherein said pressure developer means includes a pair of pressure rollers operable for contacting the pressure receiving materials; and for advancing said pressure receiving materials at speeds of up to and including 100 mm/sec. under pressure.

9. The image forming apparatus as claimed in claim 6, wherein said pressure developer means includes a pair of pressure rollers and operable for contacting the pressure receiving materials; and at least one additional roller in contact with at least one of said pair of pressure rollers and having a diameter which is greater than the diameter of said at least one of said pair of pressure rollers.

10. An image forming apparatus using pressure receiving materials, said pressure receiving materials including a receiving medium and a photosensitive medium having microcapsules on a front surface thereof, each microcapsule containing at least an optically hardening or softening matter and a color former; the photosensitive medium being first superposed on the receiving medium after exposing the photosensitive medium to light representative of the image to be formed and being then pressed against the receiving medium for development of the image on the receiving medium, the apparatus comprising:
 a photosensitive medium container for storing said photosensitive medium;
 exposing means for exposing said photosensitive medium to light representative of the image;
 a receiving medium container for storing said receiving medium; and
 pressure developer means having a pair of pressure rollers for pressing the pressure receiving materials for development of the image on the receiving medium; and
 a first mechanism means operable for moving said pressure rollers toward each other when said receiving medium is positioned between said pair of pressure rollers and for moving said pressure rollers away from each other when said receiving medium is not positioned between said pair of pressure rollers.

11. The image forming apparatus of claim 10 further including a receiving medium container, said receiving medium container including tray means for holding said receiving medium and detecting means for detecting the size of the recording medium.

12. The image forming apparatus as claimed in claim 10, wherein said pressure developer means includes detecting means disposed near said pressure rollers for detecting the top and bottom ends of said receiving medium, said first mechanism means including means operable for moving one of said pressure rollers away from and towards said other of said pressure rollers, said pressure receiving materials disposed between said pressure rollers whereby said pressure receiving materials are not pressed between said pressure rollers except during pressure development period.

13. The image forming apparatus as claim in claim 10, wherein said pressure developer means further includes at least one additional roller for contacting at least one of said pair of pressure rollers and having a diameter which is greater than said at least one of said pair of pressure rollers.

14. The image forming apparatus as claimed in claim 10, further including means for rotating at least one of said pair of pressure rollers for advancing said pressure receiving materials at speeds of up to and including 100 mm/sec. under pressure.

15. The image forming apparatus as claimed in claim 10, wherein said first mechanism means is rotatably held by two movable frames.

16. The image forming apparatus as claimed in claim 10, wherein said pressure developer means includes first detecting means disposed near said pressure rollers for detecting the top and bottom ends of said receiving medium; and said receiving medium container includes second detecting means for detecting the width and the length of said receiving medium whereby the time interval for exposing said photosensitive medium to said light and the time interval for applying pressure to said pressure receiving material are controlled based on these detections from the first detecting means and second detecting means.

17. The image forming apparatus as claimed in claim 10, further including an external drive shaft and wherein said photosensitive medium container includes a supply shaft around which the unexposed portion of said photosensitive medium is wound and which communicates with the external drive shaft, a cartridge for rotatably supporting said supply shaft, for guiding the unexposed portion of said photosensitive medium on its rear surface and for preventing exposure to light of the unexposed portion of the photosensitive medium; a storage shaft around which the exposed portion of the photosensitive medium is wound and which communicates with the external drive shaft, and a cassette for rotatably supporting said storage shaft and for holding said cartridge.

18. The image forming apparatus as claimed in claim 10, wherein said photosensitive medium container has a cassette which includes a supply shaft around which the unexposed portion of said photosensitive medium is wound and a storage shaft around which the exposed portion of said photosensitive medium is wound; said photosensitive medium forming a continuous path between said supply shaft and storage shaft with the top end of said photosensitive medium coupled to said storage shaft, and further includes a preformed shaped member protruding outwardly from said cassette and conforming to said path; said path of said photosensitive medium being established by said shaped member prior to inserting said photosensitive medium in the image forming apparatus.

19. The image forming apparatus as claimed in claim 10, further including a second mechanism means having a plurality of clutches for rotating a supply shaft around which the unexposed portion of said photosensitive medium is wound and a storage shaft around which the exposed portion of said photosensitive medium is wound; said pressure developer means including a pressure roller operable for moving into or out of contact with the pressure receiving materials for applying pressure thereto, and further including a pressing contact roller operable for moving into and out of contact with said photosensitive medium for transporting the same; wherein said second mechanism means is operable for unwinding and rewinding about said supply shaft that portion of said photosensitive medium which has passed by said exposing means.

20. The image forming apparatus of claim 18, wherein the pair of pressure rollers have unequal diameters.

21. The image forming apparatus of claim 10, wherein the first mechanism means includes an additional roller and cam means coupled to said additional roller for moving said additional roller in a linear reciprocating motion.

22. The image forming apparatus of claim 21, wherein said additional roller contacts one of said pair of pressure rollers.

23. The image forming apparatus of claim 22, further including means for maintaining said additional roller and said one of said pair of pressure rollers in contact with each other.

24. The image forming apparatus of claim 10, further including means for detecting the beginning of said receiving medium.

25. The image forming apparatus of claim 24, further including means for detecting the end of said receiving medium.

26. The image forming apparatus of claim 25, wherein the means for detecting the beginning of said receiving medium serves as the means for detecting the end of said receiving medium.

27. The image forming apparatus of claim 26, wherein said first mechanism means is responsive to detection of the beginning of said receiving medium to move said pair of pressure rollers together and is responsive to detection of the end of said receiving medium to move said pair of pressure rollers away from each other.

28. The image forming apparatus of claim 10, further including means for advancing said photosensitive medium in a first direction.

29. The image forming apparatus of claim 28, further including means for advancing the photosensitive medium in a second direction opposite to said first direction.

30. The image forming apparatus of claim 29, wherein one of said pair of pressure rollers serves as the means for advancing said photosensitive medium in a first direction.

31. The image forming apparatus of claim 30, further including auxiliary rolling means for pressing said photosensitive medium against said one of said pair of pressure rollers for aiding in the advancement of said photosensitive medium in said first direction.

32. The image forming apparatus of claim 30, further including detecting means for detecting the beginning and end of said receiving medium and means for driving said one of said pair of pressure rollers in said first and second directions wherein said means for driving is inactivated in response to the detection of the beginning of said receiving medium and is reactivated in response to the detection of the end of said receiving medium.

33. The image forming apparatus of claim 10, further including a plurality of support plates for rotatably supporting said pair of pressure rollers.

34. The image forming apparatus of claim 33, further including means for detaching at least one of said plurality of support plates from at least one end of at least one of said pair of pressure rollers.

35. In an image forming apparatus for forming an image on a receiving medium by pressing the receiving medium against a photosensitive medium having light sensitive microcapsules thereon, a pressure developing device comprising:

a pair of pressure rollers for receiving and pressing said photosensitive medium and receiving medium together; and means for moving said pair of pressure rollers towards and away from each other and including a detachable coupling support plate and supporting means operable for supporting at least one of said pressure rollers at both of its ends by attaching said coupling support plate to said supporting means and operable for supporting at least one of said pressure rollers at only one of its ends by detaching said coupling support plate from said supporting means to permit said photosensitive medium to be removed from and inserted into said apparatus.

36. The image forming apparatus of claim 35, further including a receiving medium container, said receiving medium container including tray means for holding said receiving medium and detecting means for detecting the size of the recording medium.

37. An image forming apparatus using pressure receiving materials, said pressure receiving materials including a receiving medium and a photosensitive medium having microcapsules on a front surface thereof, each microcapsule containing at least an optically hardening or softening matter and a color former, the photosensitive medium being first superposed on the receiving medium after exposing the photosensitive medium to light representative of the image to be formed and being then pressed against the receiving medium for development of the image on the receiving medium, the apparatus comprising:

an exposure table on which said photosensitive medium is exposed for forming a latent representation of the image on the photosensitive medium and which guides said photosensitive medium on its rear surface; and pressure means including pressure roller means for applying pressure to the pressure receiving materials during development of the image on the receiving medium, for guiding the rear surface of said photosensitive medium by contact with an outer circumferential surface of said pressure roller means, and for transporting the photosensitive medium, said pressure roller means including a pair of pressure rollers and means for moving said pressure rollers towards each other when said receiving medium is positioned between said pair of pressure rollers and for moving said pressure rollers away from each other when said receiving medium is not positioned between said pair of pressure rollers.

38. In an image forming apparatus for forming an image on a receiving medium by pressing the receiving medium against a photosensitive medium having light sensitive microcapsules thereon, a photosensitive medium having light sensitive microcapsules thereon, a photosensitive medium container comprising:

a member for rotatably supporting a supply shaft around which that portion of the photosensitive medium not exposed to light is wound;

a storage shaft for rotatably storing that portion of the photosensitive medium which has been exposed to light; and preformed shape member means protruding outwardly from the body of the container, detachably mounted to said container and for guiding the photosensitive medium between said supply shaft and said storage shaft only prior to formation of the image on said recording medium.

39. The image forming apparatus of claim 38, wherein said container further includes means for detachably mounting the member and supply shaft to said container.

40. In an image forming apparatus for forming an image on a receiving medium by pressing the receiving medium against a photosensitive medium having light sensitive microcapsules thereon, a pressure developing device comprising:

a pair of pressure rollers for receiving and pressing said photosensitive medium and receiving medium together;

means for moving said pair of pressure rollers towards and away from each other;

a pair of frames in which said pair of pressure rollers is housed;

a shaft about which said pair of frames pivotably open and close; and means for coupling the first of said pressure rollers to one of said pair of frames and the other of said pressure rollers to the other of said pair of frames whereby upon pivoting the frames open the pair of pressure rollers become separated from each other.

41. In an image forming apparatus for forming an image on a receiving medium by pressing the receiving medium against a photosensitive medium having light sensitive microcapsules thereon, a receiving medium container comprising:

tray means for holding said receiving medium;

detecting means for detecting the size of the recording medium; and a pair of positioning plates for positioning along the width and length of the receiving medium; each positioning plate having a contact point member extending outside the tray means and operable for engaging the detecting means.

42. The image forming apparatus of claim 41, wherein the detecting means includes a pair of detectors fixedly predisposed relative to the tray means.

43. A method for forming an image using pressure receiving materials, said pressure receiving materials including a receiving medium and a photosensitive medium having microcapsules on a front surface thereof, comprising:

exposing the photosensitive medium to light representative of the image to be formed;

superposing on the receiving medium the photosensitive medium;

detecting the presence of the beginning of the receiving medium near a pair of pressure rollers;

moving the pair of pressure rollers towards each other so as to exert pressure on the pressure receiving materials as the materials travel between the pressure rollers; and detecting the end of the receiving medium so as to separate the two pressure rollers from each other.

44. The method of claim 43, further including moving an additional roller in a linear reciprocating manner.

45. The method of claim 44, further including maintaining said additional roller and one of said pair of pressure rollers in contact with each other.

46. A method for forming an image on a receiving medium by pressing the receiving medium against a photosensitive medium having light sensitive microcapsules thereon, comprising:

moving of a pair of pressure rollers out of contact with each other;

positioning a guide member of a container between the pair of pressure rollers; said container including a supply shaft around which that portion of the photosensitive medium unexposed to light is wound, a storage shaft for rotatably storing that portion of the photosensitive medium which has been exposed to light and the guide member attachable to an end portion of the photosensitive medium and protruding outwardly from the body so as to pass through a pair of said pressure rollers while said pair of pressure rollers are out of contact with each other;

rotatably storing said guide member on said storage shaft;

exposing a portion of said photosensitive medium to light;

overlapping the exposed photosensitive medium on said receiving medium; and pressing the overlapped exposed photosensitive medium and receiving medium together by moving the pair of pressure rollers towards each other for developing.

47. In an image forming apparatus for forming an image on a receiving medium by pressing the receiving medium against a photosensitive medium having light sensitive microcapsules thereon, a photosensitive medium container comprising:
- a member for rotatably supporting a supply shaft around which that portion of the photosensitive medium not exposed to light is wound;
- a storage shaft for rotatably storing that portion of the photosensitive medium which has been exposed to light; and
- preformed shaped member means protruding outwardly from the body of the container, attached to the front of said photosensitive medium and to said storage shaft and flexible for moving along a path between said supply shaft and said storage shaft to thereby guide said photosensitive medium between said supply shaft and said storage shaft.

* * * * *